United States Patent [19]

Johannsmeier et al.

[11] 4,070,117
[45] Jan. 24, 1978

[54] APPARATUS FOR THE AUTOMATIC ALIGNMENT OF TWO SUPERIMPOSED OBJECTS, E.G. A SEMICONDUCTOR WAFER AND MASK

[75] Inventors: Karl-Heinz Johannsmeier, Mountain View; Paul E. Stoft, Menlo Park; Tor G. Larsen, Cupertino, all of Calif.

[73] Assignee: Kasper Instruments, Inc., Sunnyvale, Calif.

[21] Appl. No.: 650,976

[22] Filed: Jan. 21, 1976

Related U.S. Application Data

[60] Division of Ser. No. 305,861, June 12, 1972, Pat. No. 3,955,072, which is a continuation of Ser. No. 126,597, March 22, 1971, abandoned.

[51] Int. Cl.² .................. G06F 15/46; H05K 13/00
[52] U.S. Cl. .................... 356/172; 250/237 R; 250/561; 355/86; 356/138; 356/153
[58] Field of Search .......... 250/237 R, 237 G, 221, 250/222 R, 561; 355/53, 78, 86, 95; 356/170, 171, 172, 138, 153

[56] References Cited

U.S. PATENT DOCUMENTS

| | | | |
|---|---|---|---|
| 3,114,842 | 12/1963 | Davidson | 250/237 R |
| 3,193,688 | 7/1965 | Morton et al. | 250/237 R |
| 3,437,816 | 4/1969 | Mushinsky | 250/237 R |
| 3,541,338 | 11/1970 | Duda et al. | 250/201 |
| 3,560,097 | 2/1971 | Gavrilkin et al. | 250/237 R |
| 3,569,718 | 3/1971 | Borner | 250/237 R |
| 3,712,740 | 1/1973 | Hennings | 356/166 |
| 3,796,497 | 3/1974 | Mathisen et al. | 356/172 |

*Primary Examiner*—Paul A. Sacher
*Assistant Examiner*—R. A. Rosenberger
*Attorney, Agent, or Firm*—Roland I. Griffin

[57] ABSTRACT

An apparatus for automatically aligning a semiconductor wafer with a mask in the manufacture of integrated circuit devices is disclosed. The mask and wafer are each provided with alignment patterns, the alignment pattern on the wafer cooperating with the alignment pattern on the mask in a unique visual manner to signify alignment. A scanning mechanism is provided for automatically scanning the alignment pattern areas and producing output signals indicative of the relative positions of the alignment patterns on the wafer and mask. Logic circuitry is provided for operating in response to any misalignment represented by the scan output signals to compute formulae which are utilized to produce control signals for driving motor drive mechanisms to produce relative movement between the mask and wafer to bring them into alignment. Several separate alignment cycles are provided, if needed, for zeroing in on finalized alignment. A tolerance selection control circuit is provided for permitting a variation in final alignment tolerance.

20 Claims, 17 Drawing Figures

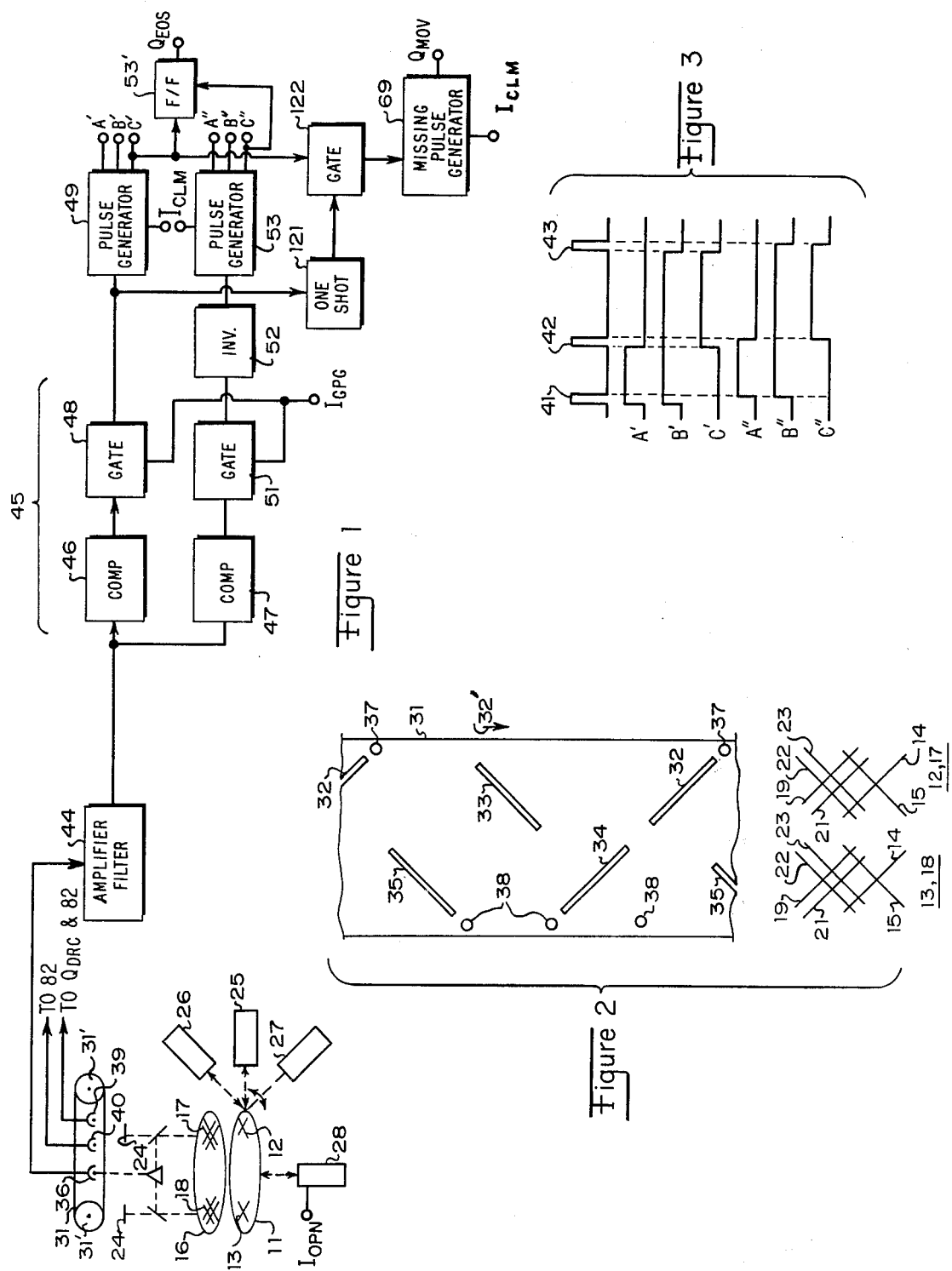

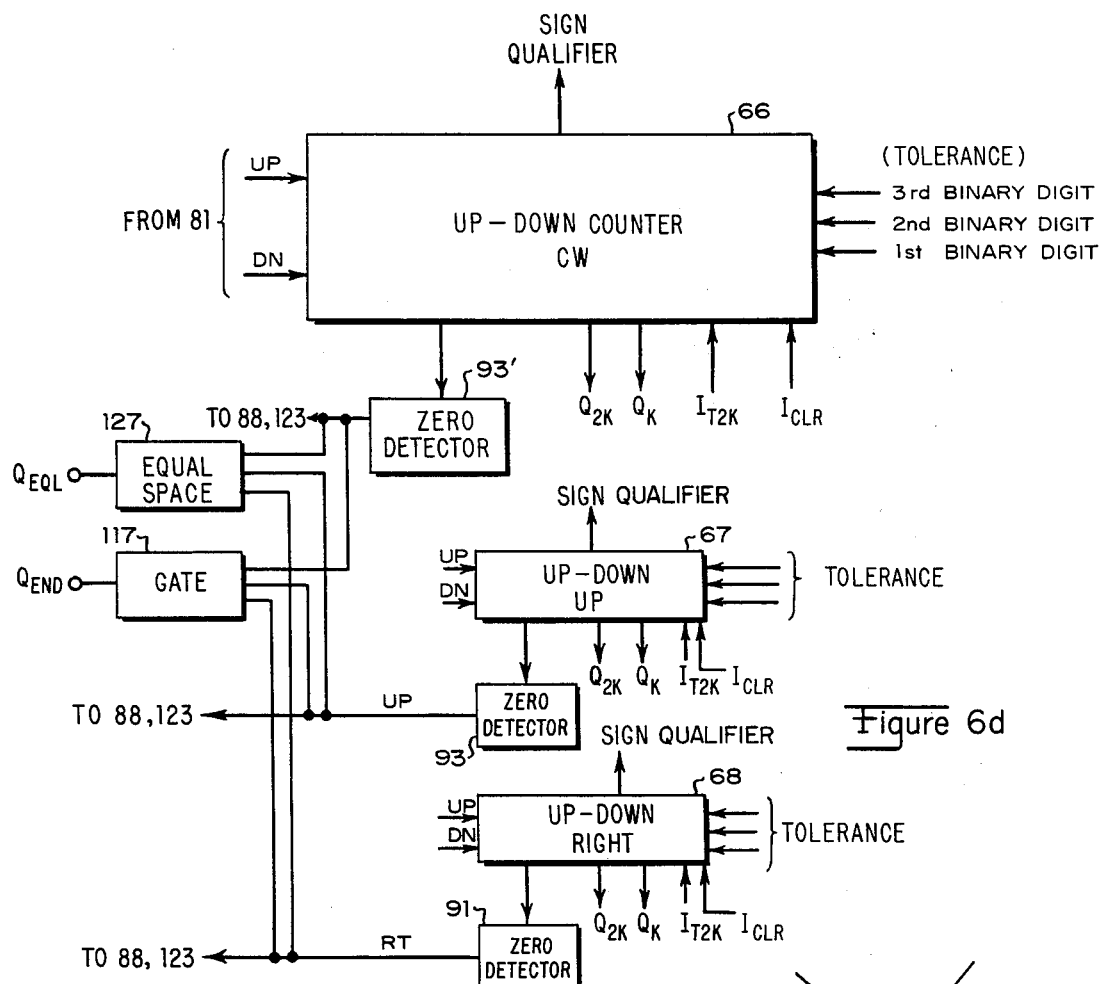
Figure 6d
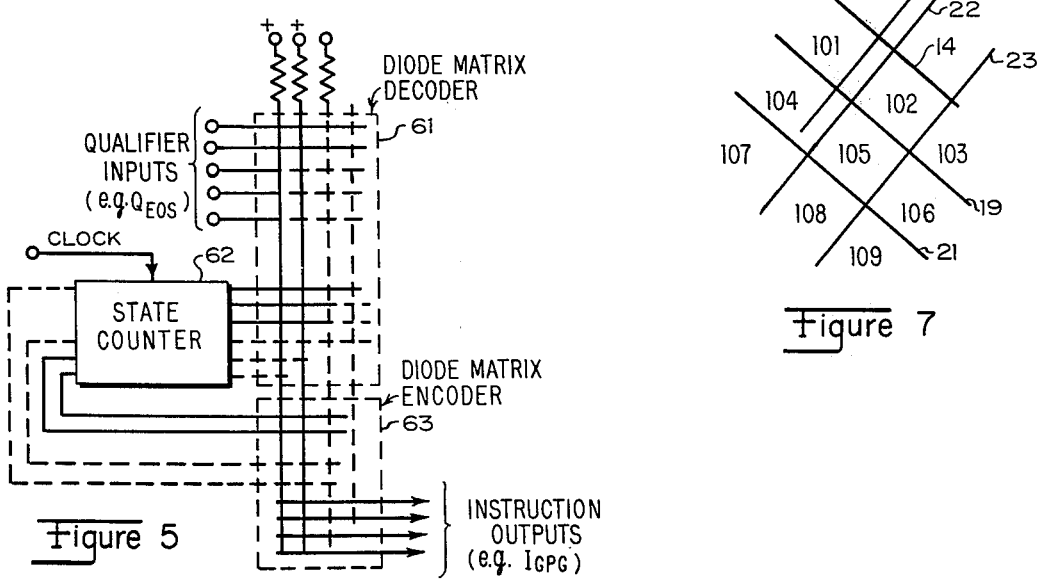
Figure 5
Figure 7

APPARATUS FOR THE AUTOMATIC ALIGNMENT OF TWO SUPERIMPOSED OBJECTS, E.G. A SEMICONDUCTOR WAFER AND MASK

CROSS REFERENCE TO RELATED APPLICATION

This is a division of U.S. Pat. Application Ser. No. 305,861 filed on June 12, 1972, and issued as U.S. Pat. No. 3,955,072 on May 4, 1976, which application is in turn a continuation of U.S. Pat. Application Ser. No. 126,597 filed on Mar. 22, 1971, and now abandoned.

BACKGROUND OF THE INVENTION

In the present day manufacture of integrated circuits, complex circuit patterns are formed on a silicon wafer by photoresist techniques employing a series of contact printings on the wafer. These contact printings are made from several transparent masks used in succession and in a preselected order. Each successive mask must be accurately aligned with the previous print or prints made on the wafer from the prior masks so that the completed pattern is accurate within a few microns.

The alignment of each mask with the wafer may be accomplished manually by manipulation of the mask over the wafer while the operator observes the mask and wafer through a high power microscope. Alignment may be added by the use of a pair of spaced-apart alignment patterns, for example, crosses or bull's-eyes, formed on each of the wafer and mask, the pair of alignment patterns on the mask being arranged so that they are superimposed over and aligned with the pair of alignment patterns on the wafer when the wafer and mask are properly aligned.

Apparatus has been proposed for producing alignment of the mask and wafer automatically, thus relieving the operator of this tedious task. One form of such automatic apparatus is described in U.S. Pat. No. 3,497,705 issued Feb. 24, 1970, to A. J. Adler and entitled "Mask Alignment System Using Radial Patterns And Flying Spot Scanning". In that system a pair of spaced-apart radial alignment patterns on the wafer is adapted for alignment with a superimposed pair of spaced-apart radial alignment patterns on the transparent mask. The radials of the alignment patterns on the mask are uniformly angularly displaced relative to the radials of the alignment patterns on the wafer when the mask and wafer are properly aligned. A scanning system employing two flying spot scanners scans each of the two pairs of alignment patterns in a circular manner about a center point, measuring the angular distance between the successive radicals encountered by the scanning beam. Error signals derived from misalignment of the radials of the alignment patterns on the mask relative to the radials of the alignment patterns on the wafer are utilized to produce relative movement in X, Y, and rotational directions to bring the two pairs of alignment patterns into proper alignment.

SUMMARY OF THE INVENTION

The present invention relates to an improved method and apparatus for the automatic alignment of two superimposed objects, for example, a semiconductor wafer and a transparent mask employed in integrated circuit manufacture. Both the wafer and mask are provided with a pair of spaced-apart alignment patterns, each alignment pattern on the wafer comprising a plurality of opaque marks oriented in different directions relative to one another. Each alignment pattern on the mask comprises a plurality of opaque marks, which, when the alignment patterns on the mask are properly aligned with the alignment patterns on the wafer, are oriented in the same directions as associated marks of the corresponding alignment pattern on the wafer, but are linearly spaced a predetermind distance from those associated marks.

To provide automatic alignment of the wafer and mask after a coarse alignment has been made, a scanning system is employed to first scan the alignment patterns on the wafer and mask so as to examine the marks thereof extending in one direction and the marks thereof extending in another direction and produce information designating the positions, i.e., the directions off center alignment, of the marks of the alignment patterns on the mask relative to the associated marks of the corresponding alignment patterns on the wafer. The alignment patterns on the wafer and mask are then scanned again so as to examine the marks thereof extending in said one direction and the marks thereof extending in said other direction and produce information designating the distances off center alignment of the marks of the alignment patterns on the mask relative to the associated marks of the corresponding alignment patterns on the wafer. Control signals are derived from the position or direction information and the distance information produced from these scans. These control signals serve to drive a movable support mechanism for moving the wafer relative to the mask to bring them into alignment. The scanning system may be programmed to perform additional scans as required to provide optimum alignment.

In one embodiment of the present invention the marks are elongated bars, the bars extending in said one direction being directed at a substantial angle, for example, 90°, relative to the bars extending in said other direction. When aligned, the bars on the mask are positioned a predetermined linear distance from the associated bars on the wafer. The scanning system includes an opaque belt having a plurality of slots therein, one slot being oriented in the same direction as the bars extending in said one direction and another slot being oriented in the same direction as the bars extending in said other direction. As the slots in the belt scan over the bars of the alignment patterns on the wafer and mask, light passing through the slots is interrupted by the opaque bars and produces a plurality of spaced-apart pulses. The time between pulses serves as an indication of the relative positions of the bars of the alignment patterns on the wafer and mask and the distances between those bars, and thus as a measure of the alignment of the alignment patterns on the mask with the corresponding alignment patterns on the wafer. By controlling the length of the bars and slots, pulses with a good signal-to-noise ratio may be obtained. In any case, the signal-to-noise ratio of this system utilizing elongated bars and slots is substantially better than that for systems using flying spot scanners or the like.

In the preferred embodiment of the present invention only one bar is scanned at any one point in time. Thus, unlike systems utilizing cathode ray tube scanners and photo-tubes, a single sensor of simple design, such as a photo-tube, may be employed in this system to produce the output pulses. In the preferred embodiment of the present invention the scanning system is also provided with a control circuit for selecting one of several tolerances within which alignment between the alignment patterns on the mask and wafer will be accepted as satisfactory by the scanning system.

DESCRIPTION OF THE DRAWINGS

FIG. 1 is a block diagram of the alignment pattern scanning system and related pulse generating components of an automatic alignment system according to the preferred embodiment of the present invention.

FIG. 2 is a view of the scanning belt of the scanning system of FIG. 1 and the two alignment pattern areas scanned therewith.

FIG. 3 is a waveform diagram showing the pulses generated by the scanning system and pulse generating components of FIG. 1.

FIG. 5 is a schematic diagram illustrating one form of logic control circuit including a state counter, a decoder, and an encoder utilized in the automatic alignment system.

FIGS. 6a–d together form a block diagram of the remaining portions of the automatic alignment system.

FIG. 7 is an illustration of the sectoring of the double-cross alignment pattern area of FIGS. 1 and 2.

FIG. 10 is a schematic diagram of a logic circuit that may be employed as the pattern area position determining system of FIG. 6a.

DESCRIPTION OF THE PREFERRED EMBODIMENTS

Figure 4:
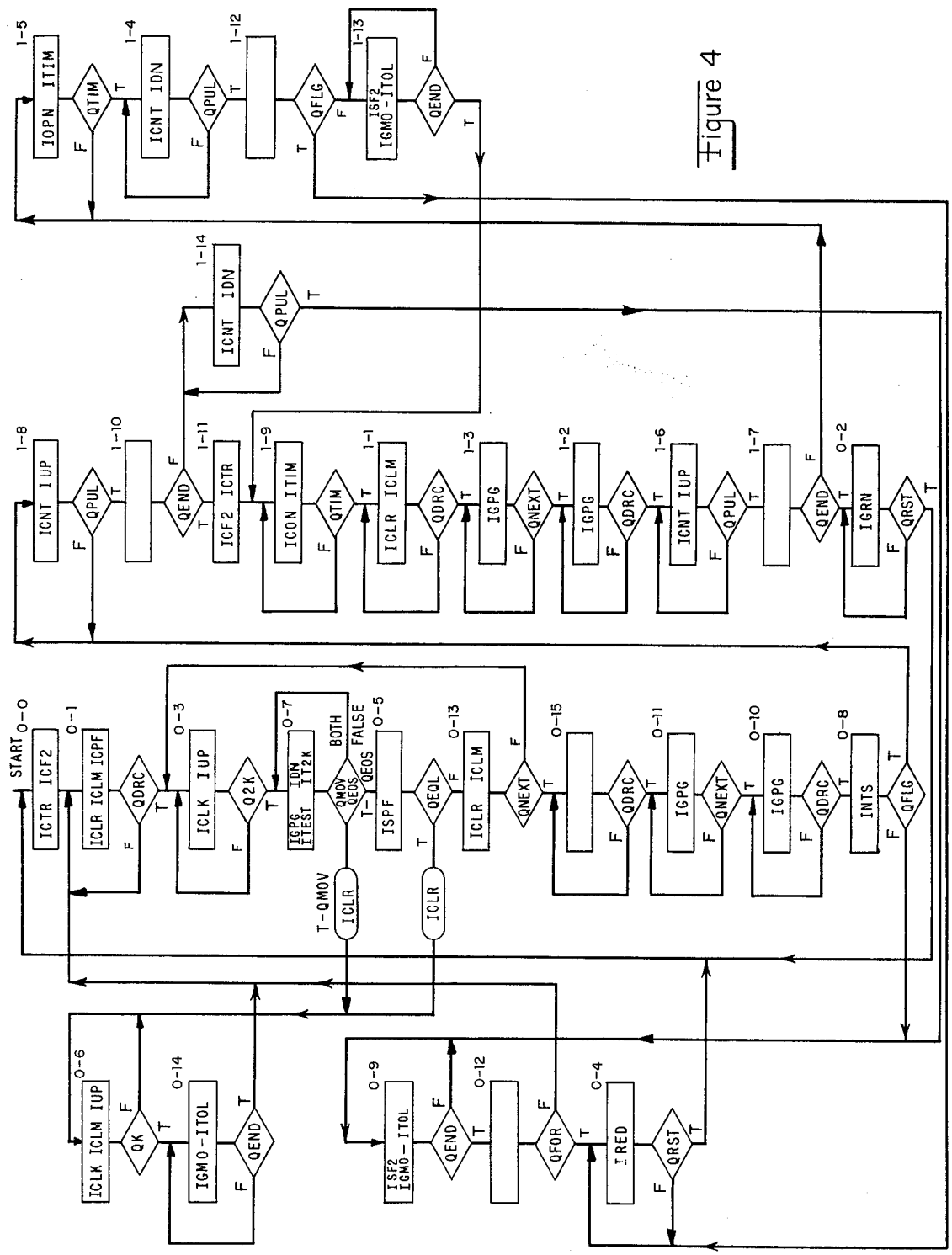
FIG. 4 is a flow chart illustrating the sequence of operation of the automatic alignment system.

Referring now to FIGS. 1, 2, and 3, a semiconductor wafer 11 is provided with a pair of alignment patterns 12 and 13 spaced apart on its upper surface near the ends of a diameter of the wafer, each alignment pattern comprising a dark single cross consisting of bars 14 and 15. The bars 14 are at some convenient substantial angle, for example, 90°, relative to the bars 15.

A transparent mask 16 is provided with a pair of alignment patterns 17 and 18 spaced apart along a diameter of the mask a distance equal to the separation of the alignment patterns on the wafer, each of the alignment patterns 17 and 18 comprising a dark double cross consisting of two pairs of parallel, closely spaced bars 19 and 21 and 22 and 23. the bars 19 and 21 are directed at an angle relative to the bars 22 and 23 equal to the angle between the bars 14 and 15 such that, when the mask is properly aligned over the wafer, the single crosses are located centrally within the double crosses with the bars 14 parallel to and centered within the bars 19 and 21 and with a like relationship between the bars 15 and the bars 22 and 23. Other alignment relationships may be employed as discussed below.

As in conventional mask alignment machines, the wafer 11 and mask 16 are positioned in coarse alignment under a high power microscope that provides a split-screen image of the two pattern areas on the wafer and mask for visual examination by the operator at focal points 24. The operator may activate one or more of three reversible motor drive mechanisms 25, 26, and 27 for moving the wafer in an X (right or left), Y (up or down), or rotational (clockwise or counter-clockwise) direction, respectively, to bring the alignment patterns 12 and 13 on the wafer into alignment patterns 17 and 18, respectively, on the mask. An air operated piston 28 serves to move the wafer 11 up into and down away from contact with the mask 16.

In addition to the operator-controlled alignment capability, an automatic alignment capability is provided. For this purpose, a split-screen image of the plurality of crosses of the two alignment pattern areas 12, 17 and 13, 18 is produced at an optical image plane coincident with a rapidly moving opaque scanning belt 31, which is driven by drive wheels 31' to scan the two alignment pattern areas in the direction of the arrow 32' (see FIG. 2). The two alignment pattern areas 12, 17 and 13, 18 are magnified, for example, 10×1 (the image size), allowing an aquisition range of about 20×20 mils. The belt 31 actually scans in a direction normal to the direction depicted in FIG. 1, i.e., normal to the plane of the drawing as more clearly represented in FIG. 2.

The belt 31 is provided with two continuous rows of pairs of slots, the pairs of slots 32 and 33 of the right hand row scanning the image of the alignment pattern area 12, 17 and the pairs of slots 34 and 35 of the left hand row scanning the image of the alignment pattern area 13, 18. Slots 32 and 33 of the right hand row are offset equidistantly between the slots 34 and 35 of the left hand row, the slots of each row alternating in direction such that alternate slots of each row are substantially parallel to the same bars of the alignment patterns on the wafer 11 and mask 16. For example, the slots 32 and 34 extend in the same direction as the bars 14, 19, and 21 while the slots 33 and 35 extend in the same direction as the bars 15, 22, and 23.

A light sensor 36, such as a photocell, is positioned behind the belt 31 so as to detect the light passing through the slots in the belt as the slots scan the image of the alignment pattern areas. As each slot passes each bar of the image that is oriented in the same direction as the slot, an output pulse is produced from the sensor 36. Thus, as each slot 32 passes the three bars 14, 19, and 21, three output pulses are produced. No output pulse is produced by the passage of each slot 32 over the bars 15, 22, and 23 since those bars extend transverse rather than parallel to the slots 32 and therefore intercept a negligible amount of light.

The scanning belt 31 is provided with a right hand row of holes 37, one being located just before every slot 32, and with a left hand row of holes 38, one being located just before every slot 34, 33, and 35. A photosensor 39 detects light passing through the holes 37 from a suitable light source (not shown) while another photosensor 40 detects light passing through the holes 38. Thus, an output pulse is obtained from the sensor 39 just before each slot 32 scans the alignment pattern area 12, 17 and is followed by three output pulses from the other sensor 40, one just before each of the next three scans by the three slots 34, 33, and 35, respectively.

These output pulses serve, as described below, to keep track of each series of scans of the two alignment pattern areas 12, 17 and 13, 18, each such series comprising a scan of the alignment pattern area 12, 17 by open pair of slots 32 and 33 and a scan of the alignment pattern over 13, 18 by another associated pair of slots 34 and 35.

As each slot 32 sweeps past the bars 14, 19, and 21 of the alignment pattern area 12, 17, three output pulses 41, 42, and 43 (see FIG. 3) are obtained from the sensor 36. The time period between these three pulses 41, 42, and 43 depends upon the position of the bar 14 relative to the two bars 19 and 21. For example, if the bar 14 is located a substantial distance below the two bars 19 and 21 as shown in FIG. 2, the last pulse 43 obtained from the bar 14 is separated by a substantial time period from the first two pulses 41 and 42 obtained from the two bars 19 and 21, respectively, these latter two pulses being a fixed time period apart due to the fixed spacing between the two bars 19 and 21. Should the bar 14 be located above the two bars 19 and 21, the last two pulses 42 and 43 obtained from the bars 19 and 21 would be separated from each other by the fixed time period and would be separated from the first pulse 41 obtained from the bar 14 by a time period dependent on the spacing between the bar 19 and the bar 14. During a period of close alignment when the bar 14 is positioned between the two bars 19 and 21, the first and third pulses 41 and 43 obtained from the two bars 19 and 21 are separated by the fixed time period and the pulse 42 obtained from the bar 14 is spaced therebetween. The pulse 42 will be equally spaced in time from the pulses 41 and 43 when the bar 14 is positioned midway between the two bars 19 and 21 at optimum alignment.

As the next slot 34 sweeps past the bars 19, 21, and 14 of the alignment pattern area 13, 18, a second set of three output pulses 41-43 is produced. The relative positions and spacing in time of these output pulses is again dependent upon the location of the bar 14 relative to the two bars 19 and 21 of the alignment pattern area 13, 18.

A third set of three output pulses 41-43 is produced as the next slot 33 sweeps past the alignment pattern area 12, 17, the bars 15, 22, and 23 producing pulses separated in time dependent upon the position of the bar 15 relative to the two bars 22 and 23. Similarly, a fourth set of three output pulses 41-43 is then produced as the next slot 35 sweeps past the bars 15, 22, and 23 in the alignment pattern area 13, 18.

Thus, for each complete scan series of the two alignment pattern areas of the wafer and mask, i.e., a sweep of the alignment pattern area 12, 17 with slots 32 and 33 and a sweep of the alignment pattern area 13, 18 with slots 34 and 35, four sets of three output pulses 41-43 each are created. The timing between the output pulses in each of these sets is uniquely related to the positions of the alignment patterns on the mask relative to the corresponding alignment patterns on the wafer.

These sets of output pulses 41-43 are first passed through an amplifier-filter circuit 44 which serves to amplify the pulses and to remove extraneous noise and are then passed through a squaring circuit 45 to improve the shape of the leading and trailing edges of each pulse. The squaring circuit 45 includes a pair of comparator circuits 46 and 47 each of which serves to produce three sharp positive output pulses in response to application of each set of three pulses 41-43, these positive output pulses being produced in response to application of either positive or negative going pulses. This insures proper operation if for any reason the scanning system should deliver a negative output pulse in lieu of a positive output pulse as would be the case if one bar were opaque and another bar reflective.

The pulse output from comparator circuit 46 is transmitted via gate 48 to pulse generator 49, and the pulse output from comparator circuit 47 is transmitted via gate 51 and inverter 52 to a pulse generator 53. Pulse generators 49 and 53 operate in accordance with standard circuit techniques to provide output pulses A', B', and C' and A'', B'', and C'', respectively, in response to the pulses 41-43, the pulses produced by the pulse generators being related to the leading and trailing edges of the pulses 41-43 as shown in FIG. 3. Thus, in the first group of pulses produced by pulse generator 49 pulse A' extends from the leading edge of the first pulse 41 to the leading edge of the second pulse 42, pulse B' extends from the leading edge of the first pulse 41 to the leading edge of the third pulse 43, and pulse C' extends from the leading edge of the second pulse 42 to the leading edge of the third pulse 43. In the second group of pulses produced by pulse generator 53 pulse A'' extends from the trailing edge of the first pulse 41 to the trailing edge of the second pulse 42, pulse B'' extends from the trailing edge of the first pulse 41 to the trailing edge of the third pulse 43, and pulse C'' extends from the trailing edge of the second pulse 42 to the trailing edge of the third pulse 43.

If we assume that pulse 41 is made by bar 14 and pulses 42 and 43 are made by bars 19 and 21, respectively, then pulse C' will be of a predetermined duration established by the predetermined spacing between the bars 19 and 21 while pulse A' will be of a duration directly dependent upon the variable spacing between the bar 14 and the bar 19 (the greater the spacing, the longer the duration of pulse A'). The length of pulse B' will be dependent upon the distance between the bar 14 and the bar 21.

A similar relationship exists with regard to the pulses A'', B'', and C'', except they are formed from the trailing edges of pulses 41, 42, and 43. Combination of the pulses A', B', and C' with the pulses A'', B'', and C'', respectively, results in a pulse averaging effect as seen hereafter.

It should be noted that the scanning system may take other forms. For example, a slotted drum could be used in lieu of the belt 31. Two separate belts could also be employed, one for each of the alignment pattern areas 12, 17 and 13, 18. The belt 31 could also be replaced with a suitably slotted plate that oscillates back and forth over the alignment pattern areas and with appropriate logic circuitry to accommodate the alteration in direction of each scan.

The alignment pattern areas may also take different forms. For example, the lines or bars need not be continuous; they may be broken provided the scanning system is modified, if needed, to scan the broken lines. As an illustration, the double cross may consist of four right angles with their apexes extending in toward a common point center from four different quadrants, the sides of the right angles being spaced-apart a desired preselected distance.

To aid in visual alignment, a very small double cross may be located in the center of the major double cross 19, 21 and 22, 23 to frame the center portion of the single cross 14, 15 at alignment. The small size of this added double cross insures that it will have no effect on the pulses produced by the scanning system.

Figure 6B:
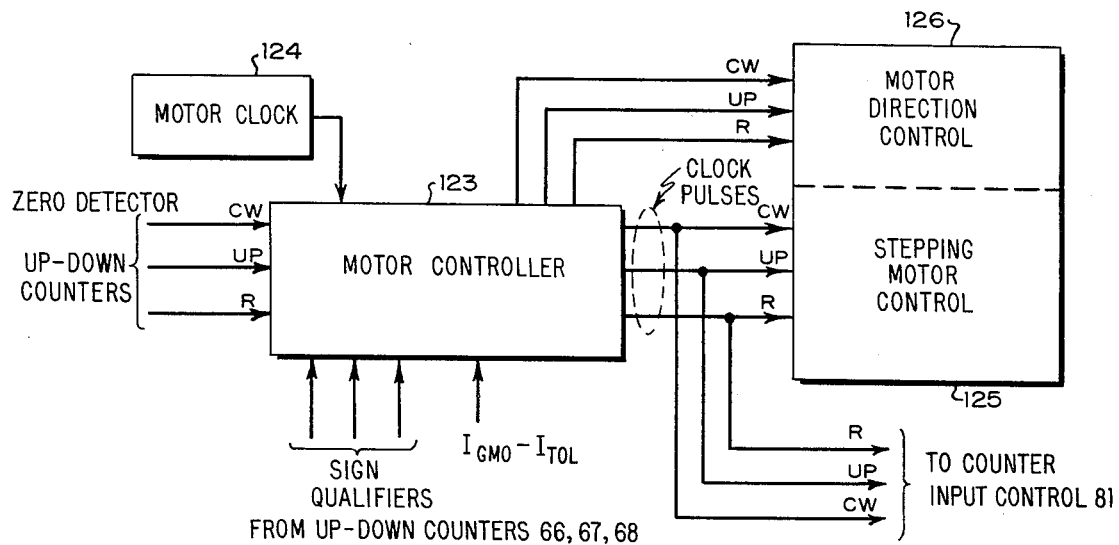
Figure 6A:
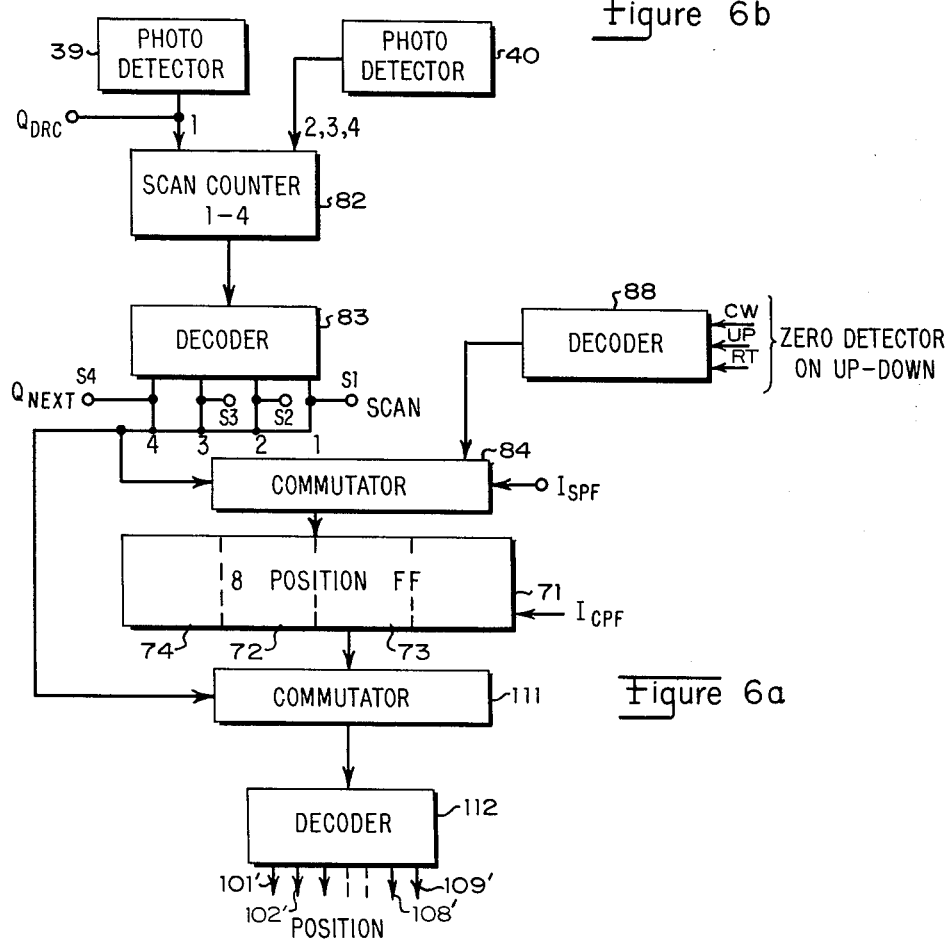
Figure 6C:
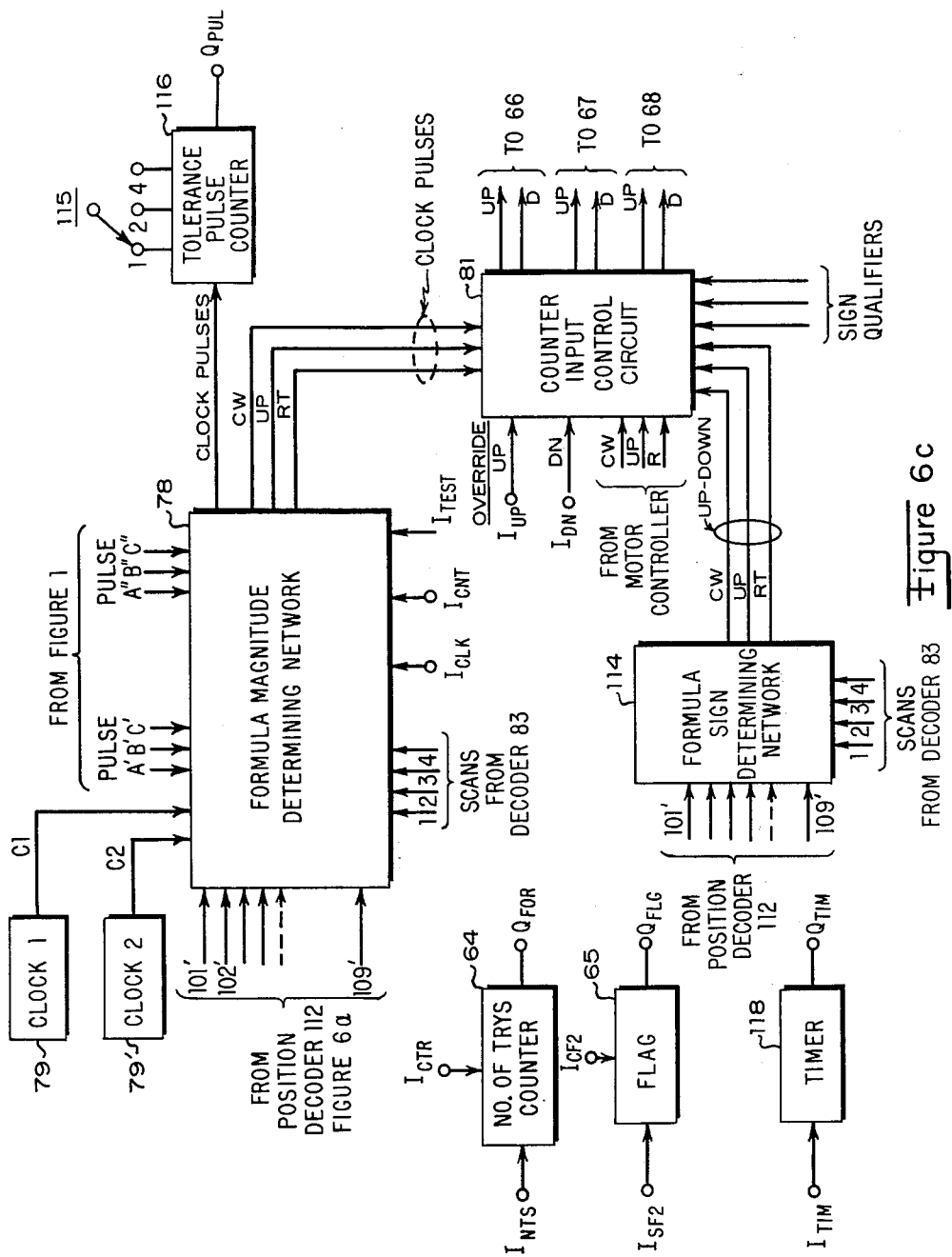

Reference is now also made to the flow chart of FIG. 4; the logic control circuit comprising decoder circuit 61, state counter 62, and encoder circuit 63 of FIG. 5; and the block diagram of FIGS. 6a–d. The automatic aligning sequence of the present invention is initiated after the mask has been coarsely aligned over the wafer, the drive mechanism 28 being moved to a position for holding the wafer spaced-apart slightly from the mask. At the start of operations, the state counter 62 is in an initial state, for example, 0—0, and subsequently changes to the next state 0-1. In state 0—0, true outputs on the $I_{CTR}$ and $I_{CF2}$ terminals or instruction outputs of the encoder circuit 63 serve to clear number of trys counter 64 (FIG. 6c) and flag circuit 65 (FIG. 6c), placing a true on the $Q_{FLG}$ output of the flag circuit. In state 0–1 true outputs on the $I_{CLR}$, $I_{CPF}$, and $I_{CLM}$ instruction outputs of the encoder circuit 63 serve to clear binary coded decimal up-down counters 66, 67, and 68 (FIG. 6d), missing pulse generator flip-flop 69 (FIG. 1), the pulse generators 49 and 53 (FIG. 1), and position flip-flop circuits 71–74 (FIG. 6a).

The pulse output obtained from the photosensor 39 in response to passage of the hole 37 positioned in the belt 31 just before the first slot 32 in the first scan series results in a true input on the qualifier input $Q_{DRC}$ to the decoder circuit 61, the logic control circuit then operating on receipt of the next clock pulse to change the state counter 62 to state 0–3 and place a true output on the instruction outputs $I_{CLK}$ and $I_{UP}$ of the encoder circuit 63. A true on the instruction output $I_{CLK}$ causes formula magnitude determining circuit 78 to transmit clock pulses C1 from clock 79 to counter input control circuit 81, which is in turn caused by the true on the instruction output $I_{UP}$ to transmit the clock pulses C1 to the up-count inputs of the clockwise, up, and right direction up-down counters 66, 67, and 68, respectively.

These three up-down counters 66–68 count up together in response to the C1 clock pulses until all three have counted up to 2K, where 2K is the number of clock pulses representing the fixed vertical spacing between the two parallel bars 19 and 21 on the transparent mask 16. When the clockwise up-down counter 66 has reached 2K, it places a true on the $Q_{2K}$ input of the decoder circuit 61 to change the state counter 62 to the next state, for example, 0–7, terminating $I_{CLK}$ and cutting off the flow of clock pulses to the three up-down counters 66–68 which come to rest with a 2K count registered in each. Four of the instruction outputs from the encoder circuit 63 are then activated, i.e., $I_{GPG}$ to activate gears 48 and 51 to open the path for the pulses 41, 42, and 43; $I_{DN}$ to activate the three count down paths in the counter input control circuit 81 to insure that the following clock pulses will pass to the count down inputs of the three up-down counters 66–68; $I_{T-EST}$ to activate the formula magnitude determining network 78, which serves to direct the clock pulses to the clockwise, up, and right direction up-down counters 66–68 as described below; and $I_{T2K}$ to activate the up-down counters 66–68.

At the time the photosensor 39 operated to produce $Q_{DRC}$ it also produced an output to clear scan counter circuit 82 (FIG. 6a), which operates via decoder 83 and commutator 84 to condition the first pair 71 of four pairs of position flip-flop circuits 71–74 for receipt of two bits from decoder circuit 88. These two bits indicate the position of the alignment pattern 17 relative to the alignment pattern 12 after the scan by slot 32, as described below.

As the first slot 32 in the belt 31 passes over the alignment pattern area 12, 17, the three pulses 41, 42, and 43 produced thereby are transmitted to the pulse generators 49 and 53 which operate to form the two seats of pulses A'-C' and A"-C", respectively, as described above. Assuming for purposes of illustration that the alignment patterns 12 and 17 are oriented so that bar 14 is above bars 19 and 21, pulses A' and A" represent the distance between bars 14 and 19, pulses B' and B" represent the distance between bars 14 and 21, and pulses C' and C" represent the distance between bars 19 and 21. These two sets of pulses A'-C' and A"-C" are transmitted to the formula magnitude determining network 78 which operates via the counter input control circuit 81 to transmit the clock pulses C1 and C2 to the down input of the clockwise direction counter 66 during the combined duration of pulses A' and A" (hereinafter referred to as pulse A), to the down input of the up direction counter 67 during the combind duration of pulses B' and B" (hereinafter referred to as pulse B), and to the down input of the right direction counter during the combined duration of pulses C' and C" (hereinafter referred to as pulse C).

In this manner, as the first slot 32 scans the bars 14, 19 and 21, the three up-down count down from the 2K count that had been registered in each of them before the initiation of the scan. Since it was assumed in this illustration that bar 14 was located above the bars 19 and 21, pulse C represents the distance between bars 19 and 21. During the existence of pulse C, 2K clock pulses are delivered to the right direction up-down counter 68. Thus, at the end of pulse C the right direction up-down counter 68 will have counted down to zero. Because of the longer length of pulses A and B, the clockwise direction and up direction up-down counters 66 and 67 will both have counted down more than 2K clock pulses and the count stored therein will therefore be something other than zero.

The activation of the $I_{T2K}$ instruction output activates an override circuit in each up-down counter 66–68 so that after the count down from 2K the first three binaries of each up-down counter will be ignored in testing for zero by zero detectors 91, 93, and 93'. In this way, a tolerance of eight counts is permitted to allow for possible variances in the vertical distance between bars 19 and 21 on different masks. The zero detector 91 operates to produce a two bit output from decoder 88 (FIG. 6a). This two bit output is indicative of the zero count down of right direction up-down counter 68.

At the end of the pulse C", the pulse generator 53 causes flip-flop 53' to place a true on the $Q_{EOS}$ qualifier input of the decoder circuit 61 and thereby change the state counter 62 to the next state, for example, 0–5. In this state a true is placed on the $I_{SPF}$ (store position flip flop) instruction output from encoder circuit 53 to commutator 84 which thereupon operates to store the two bits from the decoder 88 into the first pair of position flip-flop circuits 71.

In those instances where bar 14 is located between bars 19 and 21, pulse B represents the distance between bars 19 and 21. The up-direction up-down counter 67 then counts down 2K to zero, causing the output of its zero detector 93 to go true and resulting in a different pair of bits being stored in the first pair of position flip-flop circuits 71 from decoder 88. When bar 14 is below the two bars 19 and 21, i.e., scanned last by slot 32, pulse A represents the distance between bars 19 and 21. The clockwise direction up-down counter 66 then counts down 2K to zero, resulting in a still different pair of bits being stored in the first pair of position flip-flop circuits 71. Thus, depending on whether the bar 14 is positioned above, between, or below the two bars 19 and 21, a particular pair of bits, for example, 1-1, 1-0, or 0-1, respectively, is stored in the first pair of position flip-flop circuits 71 as a record of the positioning of those bars.

After storage of the two bits from decoder 88 in the first pair of position of flip-flop circuits 71, the state counter 62 changes to its 0-13 state as a result of a false of the $Q_{EQL}$ qualifier input to the decoder circuit 61 from equal space circuit 127 described below, resulting in activation of the $I_{CLR}$ and $I_{CLM}$ instruction outputs of encoder circuit 63. This serves to clear the up-down counters 66-68, the pulse generators 49 and 53, and the missing pulse generator flip-flop 69. The state counter 62 then changes back to its 0-3 state to reactivate the $I_{CLK}$ and $I_{UP}$ instruction outputs of the encoder 63 and again supply the 2K up count to up-down counters 66-68 prior to the scan of the alignment pattern area 13, 18 by the second slot 34.

Before the scan of alignment pattern area 13, 18 by slot 34, an output pulse from photosensor 40 due to passage of the hole 38 between slots 32 and 34 operates the scan counter circuit 82, decoder 83, and commutator 84 to condition the second pair of position flip-flop circuits 72 to receive the next two bits (indicating the position of the pattern 18 relative to the pattern 13) from decoder 88 after the scan by slot 34. As slot 34 scans bars 14, 19, and 21 of alignment pattern area 13, 18, the three pulses A, B, and C are produced as described above. In the same manner as during the scan by slot 32, pulse A controls the clock pulse flow to the clockwise counter 66, pulse B controls the clock pulse flow to the up-direction counter 67, and pulse C controls the clock pulse flow to the right-direction counter 68. One of these three counters will count down to zero dependent on the location of bar 14 relative to bars 19 and 21, i.e., dependent on whether bar 14 is above, between, or below bars 19 and 21, and bits 1-1, 1-1, or 0-1, respectively, will be stored in the second pair of position flip-flop circuits 72. The counters 66-68 will then be cleared again.

The foregoing operations are repeated for the next two scans by slots 33 and 35 of bars 15, 22, and 23 in alignment pattern areas 12, 17 and 13, 18, respectively. This results in the production and storage of one of three possible pairs of bits (i.e., 1-1, 1-0, or 0-1) in each of the third and fourth pairs of position flip-flop circuits 73 and 74. Thus, the positions of the two bars 14 relative to the associated bars 19 and 21 and the two bars 15 relative to the associated bars 22 and 23 are stored in the form of bit pairs in the four pairs of position flip-flop circuits 71-74 as a result of the first complete scan of the two pattern areas by the four slots 32-35.

During the scan by the fourth slot 35, a true appears on the $Q_{NEXT}$ output from decoder 83 and activates the $Q_{NEXT}$ qualifier input of decoder circuit 61 to change the state counter 62 to state 0-15. Upon receipt of an output pulse from photosensor 39 on the qualifier input $Q_{DRC}$ at the beginning of the next scan series, the state counter 62 changes to state 0-11 and energizes the $I_{GPG}$ instruction output of encoder circuit 63 to activate the gates 48 and 51 and permit the next series of scan output pulses to pass to the pulse generators 49 and 53.

In the case where bar 14 is located above bars 19 and 21 in alignment pattern area 12, 17 and bar 15 is located above bars 22 and 23 in the same alignment pattern area, the two pairs of bits 1—1 and 1—1 are stored in the first and third pairs of position flip-flop circuits 71 and 73. If each alignment pattern on the mask 16 is divided into nine sectors 101-109 as shown in FIG. 7, then bar 14 lies along sectors 101, 102 and 103 and bar 15 lies along sectors 101, 104, and 107. The two bars 14 and 15 share the one sector 101.

The first pulse from photosensor 39 at the start of the next scan series (i.e., as the first scan by slot 32 begins) causes scan counter 82 and decoder 83 to signal commutator 111 to transmit the two pairs of bits then stored in the two pairs of position flip-flop circuits 71 and 73 to decoder 112, where a single output 101' is made true. This true output signifies that the two bars 14 and 15 have the one sector 101 in common. The other eight outputs 102'-109' of the decoder 112 correspond to the other eight sectors 102-109, respectively.

As the second scan by slot 34 begins, the first pulse from photosensor 40 also causes scan counter 82, decoder 83, and commutator 111 to transfer the two pairs of bits from the two pairs of position flip-flop circuits 72 and 74 to the decoder 112 and to make one of the nine outputs 101'-109' true. In a similar manner, the two subsequent pulses from photosensor 40 at the start of the two following scans by slots 33 and 35 function as described above to cause the two pairs of position flip-flop circuits 71 and 73 and the two pairs of position flip-flop circuits 72 and 74, respectively, to activate one output of the decoder 112 for each of those scans. The particular bits stored in the four pairs of position flip-flop circuits 71-74 determine the particular output of the decoder 112 to be activated during each scan.

As an illustration of the formula calculation, assume that the output 109' of decoder 112 is made true for the first and third scans and the output 104' of decoder 112 is made true for the second and rourth scans (see the formula calculation table explained below). During the first scan by slot 32, a true on both the output 109' of decoder 112 and on the scan 1 output (S1) of decoder 83 activates the formula magnitude determining network 78 to direct clock pulses C1 and C2 from the clocks 79 and 79' through the counter input control circuit 81 to the up inputs of the three up-down counters 66-68 while the pulse C exists on the C' and C" inputs of formula magnitude determining network 78. Thus, during the first scan by slot 32 with the output 109' of decoder 112 true, all of the counters 66-68 count up. During the third scan with the output 109' of decoder 112 again true and with the scan 3 output (S3) of decoder 83 true, clock pulses C1 and C2 are passed to the up inputs of the clockwise and up direction counters 66 and 67 during pulse B and to the down input of the right direction counter 68 during pulse C. Thus, during the third scan by slot 33 with the output 109' of decoder 112 true, the clockwise and up direction counters 66 and 67 count up and the right direction counter 68 counts down. During the second scan with the output 104' of decoder 112 true and with the scan 2 output (S2) of decoder 83 true, clock pulses C1 and C2 are transmitted to the up input of the right direction counter 68 during pulse A and to both the up input of the clockwise direction counter 66 and the down input of the up direction counter 67 during pulse C. Thus, during the second scan by slot 34 with the output 104' of decoder 112 true, the clockwise and right direction counters 66 and 68 count up and the up direction counter 67 counts down. During the fourth scan with the output 104' of decoder circuit 112 again true and with the scan 4 output (S4) of decoder 83 true, clock pulses C1 and C2 are transmitted to the up input of both the clockwise and right direction counters 66 and 68 during pulse A. Thus, during the fourth scan by slot 35 with the output 104' of decoder 112 true, the clockwise and right direction counters 66 and 68 count up and the up direction counter 67 counts down.

The sign for the clockwise, up, and right direction counters 66-68 is determined by formula sign determining network 114 which directs the counters 66-68 to count either up or down. With an up count registered in the counters 66-68, the wafer motor drives will be moved in the clockwise, up, and right directions, whereas with a down count registered therein, the wafer motor drives will be moved in the counterclockwise, down, and left directions.

The following table gives the formula calculations performed by formula magnitude and sign determining networks 78 and 114 to obtain the instructions for controlling the wafer motor drives to move the wafer into alignment with the mask.

The right direction count formula is:

$$\frac{X_R + X_L}{4} = \frac{-A_1 - C_2 - B_3 - C_4}{4}$$

Thus, during the second series of four scans, clock pulses C1 and C2 are transmitted to and recorded in the three counters 66-68 in accordance with the above formula and depending on the alignment pattern positioning indicated at the outputs of decoder 112.

At the initiation of the fourth scan in the second series of four scans, the true on the $Q_{NEXT}$ qualifier input of decoder circuit 61 changes the state counter 62 to state 0-10. After the fourth scan in the second series of four scans and in response to the next pulse from photosensor 39 on the qualifier input $Q_{DRC}$ of decoder circuit 61, the state counter 62 changes to state 0-8 and activates instruction output $I_{NTS}$ of encoder circuit 63 to register a one count in the number of trys counter 64 as an indication that the formula has been determined for the first

| Common Sector Number | Clockwise Direction Formula $\frac{Y_R - Y_L}{4}$ | | Up Direction Formula $\frac{Y_R + Y_L}{4}$ | | Right Direction Formula $\frac{X_R + X_L}{4}$ | |
|---|---|---|---|---|---|---|
| | $Y_R$ | $-Y_L$ | $Y_R$ | $+Y_L$ | $X_R$ | $+X_L$ |
| 101 | $-A_1 - B_3$ | $+A_2 + B_4$ | $-A_1 - B_3$ | $-A_2 - B_4$ | $-A_1 + A_3$ | $-A_2 + A_4$ |
| 102 | $-A_1 - C_3$ | $+A_2 + C_4$ | $-A_1 - C_3$ | $-A_2 - C_4$ | $-A_1 - A_3$ | $-A_2 - A_4$ |
| 103 | $-A_1 + C_3$ | $+A_2 - C_4$ | $-A_1 + C_3$ | $-A_2 + C_4$ | $-A_1 - B_3$ | $-A_2 - B_4$ |
| 104 | $-C_1 - A_3$ | $+C_2 + A_4$ | $-C_1 - A_3$ | $-C_2 - A_4$ | $+A_1 + A_3$ | $+A_2 + A_4$ |
| 105 | $-C_1 + A_3$ | $+C_2 - A_4$ | $-C_1 + A_3$ | $-C_2 + A_4$ | $+A_1 - A_3$ | $+A_2 - A_4$ |
| 106 | $+A_1 + C_3$ | $-A_2 - C_4$ | $+A_1 + C_3$ | $+A_2 + C_4$ | $-C_1 - C_3$ | $-C_2 - C_4$ |
| 107 | $+C_1 - A_3$ | $-C_2 + A_4$ | $+C_1 - A_3$ | $+C_2 - A_4$ | $+C_1 + B_3$ | $+C_2 + B_4$ |
| 108 | $+C_1 + A_3$ | $-C_2 - A_4$ | $+C_1 + A_3$ | $+C_2 + A_4$ | $+C_1 + C_3$ | $+C_2 + C_4$ |
| 109 | $+C_1 + B_3$ | $-C_2 - B_4$ | $+C_1 + B_3$ | $+C_2 + B_4$ | $+C_1 - C_3$ | $+C_2 - C_4$ |

To illustrate, assume the right hand alignment patterns 12 and 17 are positioned so that the bars 14 and 15 intersect in sector 103 and the left hand alignment patterns 13 and 18 are positioned so the bars 14 and 15 intersect in sector 106. The clock pulse counts to be sent to the clockwise, up, and right direction counters 66-68 are determined as follows.

For the clockwise counter 66 the formula is $$\frac{Y_R - Y_L}{4}.$$

From the above table, the count for scan 1, right hand alignment pattern, sector 103 is given by $-A_1$. The count occurs during pulse A, and the negative sign indicates a down count, the subscript 1 indicating the scan number. From the above table, the count for scan 2, left hand alignment pattern, sector 106 is $-A_2$ which indicates a down count during pulse A. The count for scan 3 is $+C_3$ which indicates an up count during pulse C, and the count for scan 4 is $-C_4$ which indicates a down count during pulse C. Thus, the clockwise counter formula is:

$$\frac{Y_R - Y_L}{4} = \frac{-A_1 - A_2 + C_3 - C_4}{4}$$

The up direction count formula determined from sectors 103 and 106 is:

$$\frac{Y_R + Y_L}{4} = \frac{-A_1 + A_2 + C_3 + C_4}{4}$$

time. In this state, if the $Q_{FLG}$ output of the flag flip-flop 65 is true (i.e., the flag is set and not cleared), the state counter 62 changes to state 1-8 and activates the $I_{CNT}$ instruction output from encoder circuit 63 to formula magnitude determining network 78 and the $I_{UP}$ instruction output from encoder circuit 63 to counter input control circuit 81.

At this stage, a tolerance test circuit tests to determine if the alignment of the mask and wafer are within acceptable tolerances. For example, if the counts registered in all three counters 66-68 after the formula determination are zero, then optimum alignment has occurred and no movement of the wafer is necessary. Also, if the three counts are all within some predetermined tolerance, alignment is acceptable and no movement is necessary. The operator may set the tolerance (for example, a tolerance in any direction of ± 10 uin., ± 20 uin., or ± 40 uin.) by means of a switch 115.

In determining if the alignment is within a tolerance of ± 40 uin., the tolerance test circuit ignores the first three binaries in each of the counters 66-68 and looks at the fourth and greater binaries. A binary code of 0000—0000—0111, indicating a count of 7, would signify a measurement within tolerance since all the binaries above the third are zero, whereas a binary code of 0000—0000—1000, indicating a count of 8, would be outside tolerance since the fourth binary is 1. However, if the misalignment were in the other direction, and the binaries indicated a count of 996, the binaries would indicate a measurement out-of-tolerance when in fact it is within tolerance. To overcome this latter problem, counts are added to the final count in each of the three counters 66-68 before the tolerance test. In the case of a tolerance of ± 40 uin., three binaries are ignored and four counts are added. For a tolerance of ± 10 uin., one binary is ignored and one count is added, and for a tolerance of ± 20 uin., two binaries are ignored and two counts are added.

The formula magnitude determining network 78 and the counter input control circuit 81 operate in response to activation of the $I_{CNT}$ and $I_{UP}$ instruction outputs of encoder circuit 63 to deliver the tolerance count of one, two, or four pulses, as determined by the tolerance count setting of switch 115, to the up input of each of the counters 66-68, after which the $Q_{PUL}$ output of tolerance pulse counter 116 is activated to signify the end of the tolerance count. Activation of the $Q_{PUL}$ output of tolerance pulse counter 116 activates the $Q_{PUL}$ qualifier input of decoder circuit 61 and causes the state counter 62 to change to state 1-10 at which the $Q_{END}$ output of zero test gate 117 (FIG. 6d) is tested. This output will be true if the zero detectors associated with the counters 66-68 signify that all of the binaries above the third (for a four count tolerance) in each counter are zero and that all measurements are therefore within tolerance.

If all measurements are within tolerance, the $Q_{END}$ output from zero test gate 117 activates the $Q_{END}$ qualifier input of decoder circuit 61 and changes the state counter 62 to the next state 1-11 at which a true appears on the $I_{CF2}$ and $I_{CTR}$ instruction outputs of encoder circuit 63 to clear the number of trys counter 64 and the flag flip-flop 65. The state counter 62 then changes to state 1-9 and activates the $I_{CON}$ and $I_{TIM}$ instruction outputs of encoder circuit 63. Activation of the $I_{CON}$ instruction output serves to activate the air operated piston 28 to move the wafer vertically into contact with the mask, and activation of the $I_{TIM}$ instruction output serves to activate timer 118 to produce a delayed output $Q_{TIM}$ (for example, delayed 0.2 second) sufficient to enable contact between the mask and wafer to take place. The delayed output $Q_{TIM}$ from timer 118 activates the $Q_{TIM}$ qualifier input of decoder circuit 61 and changes the state counter 62 to state 1-1 at which the $I_{CLR}$ and $I_{CLM}$ instruction outputs of encoder ciruit 63 are activated to clear the up-down counters 66-68, the missing pulse generator 69, and the pulse generators 49 and 53 and to reset the flip-flop 53'.

The system now rechecks the alignment of the mask and wafer to insure that, in moving into contact, they did not shift out of alignment. In response to the next pulse from the scan belt photosensor 39 the $Q_{DRC}$ qualifier input of decoder circuit 61 is activated and the state counter 62 is changed to state 1-3. This activates the $I_{GPG}$ instruction output of encoder circuit 63 to gate the next series of scan pulses to the pulse generators 49 and 53. The two position indicating outputs (for example, 109' and 104') of decoder circuit 112 are still activated, and three new formulas are determined and the computed pulse counts stored in counters 66-68 in accordance with the positioning of the alignment patterns on the mask and wafer. At the start of the fourth scan in this series, the $Q_{NEXT}$ output from the decoder 83 changes the state counter 62 to state 1-2, maintaining the $I_{GPG}$ instruction output of encoder circuit 63 activated and preparing the $Q_{DRC}$ qualifier input of decoder circuit 61 for receipt of the pulse at the end of this scan series. Upon receipt of that pulse, the state counter 62 changes to state 1-6 and instruction outputs $I_{CNT}$ and $I_{UP}$ are made true to add the tolerance pulse count to the three counters 66-68 as described above. The $Q_{PUL}$ output of tolerance pulse counter 116 is again activated to signify the end of the tolerance pulse count and to change the state counter 62 to state 1-7.

If the zero detectors associated with the three counters 66-68 all register a zero count, the $Q_{END}$ output of zero test gate 117 is activated to change the state counter 62 to state 0-2. This lights a green lamp indicating to the operator that the mask and wafer are properly aligned and ready for printing. Following completion of the alignment operation and printing, the system is conditioned for use with a new mask in response to activation of the $Q_{RST}$ qualifier input of the decoder cirucit 61.

The above description of the operation of the automatic alignment system covers the situation where the wafer was placed in contact with the mask and a check of the alignment by the automatic alignment system disclosed that the alignment was within acceptable tolerances and no further movement of the wafer relative to the mask was necessary to optimize alignment. There will now be described several alternate stages of operation which are brought into play when less than optimum conditions are encountered.

For example, with the state counter 62 in state 0-7, it may at times happen that, on any scan series, the pulses A'-C' and A"-C" commence but, for one reason or another, do not terminate at the proper times. At the start of pulse A', a trigger pulse is delivered to a one-shot multivibrator circuit 121, which operates a fixed time period after energization to deliver an output to a gate 122. If, by the time this output of multivibrator circuit 121 appears, the pulse C' has not terminated, a true (i.e., missing pulse signal) appears on the $Q_{MOV}$ output from the missing pulse generator 69. The state counter 62 then changes from state 0-7 to state 0-6 and activates the $I_{CLK}$, $I_{CLM}$, $I_{UP}$, and $I_{CLR}$ instruction outputs of encoder circuit 63. This clears the up-down counters 66-68, the missing pulse generator 69, the pulse generators 49 and 53 and the flip-flop 53', and, in addition, operates formula magnitude determining network 78 and counter input control circuit 81 as described above to deliver clock pulses to the three up-down counters 66-68 to start these counters counting up. When the counters 66-68 have counted up to K pulses, the $Q_K$ outputs from those counters to the $Q_K$ qualifier input of decoder circuit 61 are activated. The state counter 62 then changes to state 0-14, thereby activating the $I_{GMO}$-$I_{TOL}$ instruction output from encoder circuit 63 to motor controller 123 (FIG. 6b). Pulses from a motor clock 124 are thereupon delivered via a stepping motor control circuit 125 to the clockwise, up, and right direction drive motors 25-27. The motor clock pulses are also directed to the down count inputs of the counters 66-68 via the counter input control circuit 81 to count down from the count of K pulses stored in those counters. Since the count of K pulses stored in the counters 66-68 in this example is an up count, a true appears on the sign qualifier outputs from those counters to motor controller 123 to signify to motor direction control circuits 126 that the three drive motors 25-27 are to move in a forward direction. The same sign qualifier outputs cause the counter input control circuit 81 to direct the motor clock pulses to the down count inputs counters 66-68. After K pulses have been delivered to each of the drive motors 25-27 from the motor clock 124 and the counters 66-68 have counted down to zero, the zero detectors 91, 93, and 93' cause the gate 117 to activate the $Q_{END}$ qualifier input of decoder circuit 61. The state counter 62 then changes to the 0-1 state to initiate the alignment pattern scan for position determination with the patterns now in a new position and with the conditions that caused the missing pulse signal on the $Q_{MOV}$ output of the missing pulse generator 69 now eliminated.

When the state counter 62 is in state 0-7 with all three counters 66-68 counting down from the stored 2K count, the system may also encounter a situation where one of the bars 14 or 15 lies over one of the associated bars 19, 21 or 22, 23, respectively, and where two of the three counters 66-68 therefore count down to zero. When the outputs of any two of the zero detectors 91, 93, and 93' are true the equal space circuit 127 activates the $Q_{EQL}$ qualifier input of the decoder circuit 61. Thus, subsequently the state counter 62 will change from state 0-5 to state 0-6 thereby activating the $I_{CLR}$, $I_{CLK}$, $I_{CLM}$, and $I_{UP}$ instruction outputs of the encoder circuit 63. The drive motors 25-27 will then be operated as described above to reposition the wafer relative to the mask for a new position determination.

In the above description it was assumed that, at the tolerance check, the counts registered in all three up-down counters 66-68 were within tolerance so that the system then operated to bring the wafer into contact with the mask. In those instances where one or more of the counters indicate that the alignment is not within tolerance (i.e., by a binary one appearing on any of the fourth and higher binaries), the output of the associated zero detector will indicate a non-zero state and the $Q_{END}$ output from gate 117 will be false rather than true. When the $Q_{PUL}$ output of tolerance pulse counter 116 is activated at the end of the tolerance pulse count addition and the $Q_{END}$ output of gate 117 is false, the state counter 62 changes from state 1-10 to state 1-14, activating the $I_{CNT}$ and $I_{DN}$ instruction outputs of encoder circuit 63.

Activation of the $I_{CNT}$ and $I_{DN}$ instruction outputs of encoder circuit 63 causes formula magnitude determining network 78 and counter input control circuit 81 to transmit clock pulses to the tolerance pulse counter 116 and to the down count inputs of the three up-down counters 66-68, these counters counting down to subtract the tolerance pulse count which had previously been added to them. The $Q_{PUL}$ output of the tolerance pulse counter 116 indicates the end of the tolerance pulses and changes the state counter 62 from state 1-14 to state 0-9, thereby activating the $I_{SF2}$ and $I_{GM\sigma}I_{TOL}$ instruction outputs of encoder circuit 63. The flag flip-flop 65 is thereupon set (i.e., its output is made high). In addition, the motor controller 123 is operated to deliver motor clock pulses to the clockwise, up, and right direction drive motors 25-27 for the wafer via stepping motor control circuit 125. The sign qualifier outputs from the three up-down counters 66-68 signify to the motor direction control circuits 126 the particular directions (i.e., forward or reverse) they are to move the wafer drive motors 25-27 in response to the up or down counts in the counters 66-68. These same sign qualifiers cause the counter input control circuit 81 to apply the motor clock pulses to the proper ones of the up and down inputs of the three up-down counters 66-68 to return them to zero. On return of the three up-down counters 66-68 to zero, the associated zero detectors 91, 93, and 93' cause the $Q_{END}$ output from the gate 117 to be activated. The state counter 62 then changes to state 0-12, terminating application of the motor clock pulses to the up-down counters 66-68 and the wafer drive motors 25-27.

Assuming the $Q_{FOR}$ output of the number of trys counter 64 is false (i.e., not activated), which would be the case if only one count had been stored in the number of trys counter in response to only one formula determination and movement of the wafer, the state counter 62 changes to state 0-1, activating the $I_{CLR}$, $I_{CLM}$, and $I_{CPF}$ instruction outputs of encoder circuit 63. As described above, this initiates the position determination operation of the automatic alignment system.

The position determination, formula calculation, tolerance test, etc. operations of the automatic alignment system are performed as described above to move the wafer into alignment with the mask. Each time this alignment process is performed, a count is registered in the number of trys counter 64 until such time as four attempts to align the mask have been made. A true then appears on the $Q_{FOR}$ output of the number of trys counter 64. This changes the state counter 62 from state 0-12 to state 0-4 at which time the $I_{RED}$ instruction output of encoder circuit 63 lights a red light to indicate to the operator that the system has made four attempts to align the mask and has been unsuccessful. The operator may then attempt to align the mask manually or may terminate the alignment effort, the system being conditioned for use with a new mask in response to activation of the $Q_{RST}$ qualifier input of the decoder circuit 61.

In those cases where the wafer has been moved into contact with the mask by drive motor 28 as described above and a test of the alignment has indicated that this relative movement has resulted in a shift outside of the allowable tolerance, the $Q_{END}$ output of the gate 117 will be false rather than true. When at this stage of the alignment process the $Q_{PUL}$ output of the tolerance plulse counter 116 is activated and the $Q_{END}$ output of gate 117 is false, the state counter 62 changes from state 1-7 to state 1-5. The $I_{OPN}$ and $I_{TIM}$ instruction outputs of encoder circuit 63 are thereupon activated, the $I_{OPN}$ instruction output serving to operate the air operated piston 28 to separate the wafer and the mask and the $I_{TIM}$ instruction output serving to operate the timer 118 to provide a time delay of 0.2 second to allow for the separation of the mask and the wafer after which the $Q_{TIM}$ output of timer 118 is activated to change the state counter 62 to state 1-4. The $I_{CNT}$ and $I_{DN}$ instruction outputs are thereupon activated and serve as described above the subtract the tolerance pulse count from the three up-down counters 66-68. The $Q_{PUL}$ output of the tolerance pulse counter 116 is activated at the end of the tolerance pulse subtraction to change the state counter 62 to state 1-12.

If the $Q_{FLG}$ output of the flag flip-flop 65 is clear or false, indicating that the mask and the wafer have been brought into contact only once, the state counter 62 changes to state 1-13. This activates the $I_{SF2}$ and $I_{GM\sigma}$-$I_{TOL}$ instruction outputs of encoder circuit 63. As described above, the motor controller 123 thereupon serves in response to the formula count registered in each of the three up-down counters 66-68 to transmit motor clock pulses to the three wafer drive motors 25-27 to move the wafer in the desired directions relative to the mask to achieve alignment. When the three up-down counters 66-68 have counted down to zero in response to the motor clock pulses, the $Q_{END}$ output of the gate 117 is activated to change the state counter 62 to state 1-9 which, as described above, results in the wafer and the mask again being brought into contact and the alignment of the mask and the wafer then being automatically rechecked.

The $I_{SF2}$ instruction output given during state 1-13 serves to set the flag flip-flop 65, thereby activating or placing a true on its $Q_{FLG}$ output so that, if the subsequent recheck of the alignment of the mask and the wafer shows a misalignment thereof, the presence of the true on the $Q_{FLG}$ output of the flag flip-flop, when the $Q_{PUL}$ output of the tolerance pulse counter 116 is thereafter activated or made true following the tolerance pulse count subtraction of state 1–4, will change the state counter 62 to state 0–4. The $I_{RED}$ instruction output will then be activated to light the red light and indicate to the operator that the mask and wafer have been aligned and brought into contact twice and that final alignment has been unsuccessful.

Figure 8:
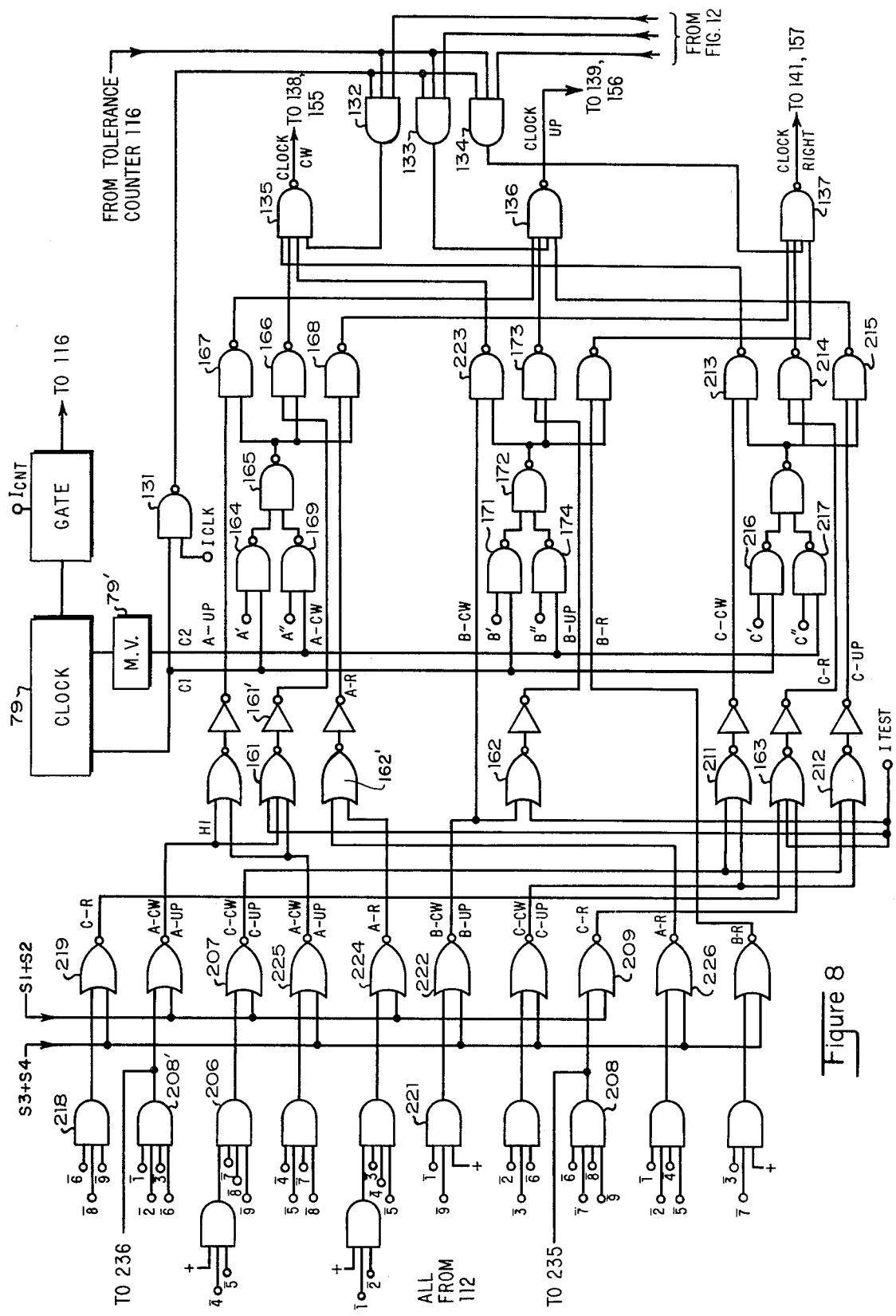
FIGS. 8 and 9 are schematic diagrams illustrating one form of logic circuitry that may be utilized in the formula magnitude determining network and counter input control circuit of FIG. 6c.
Figure 9:
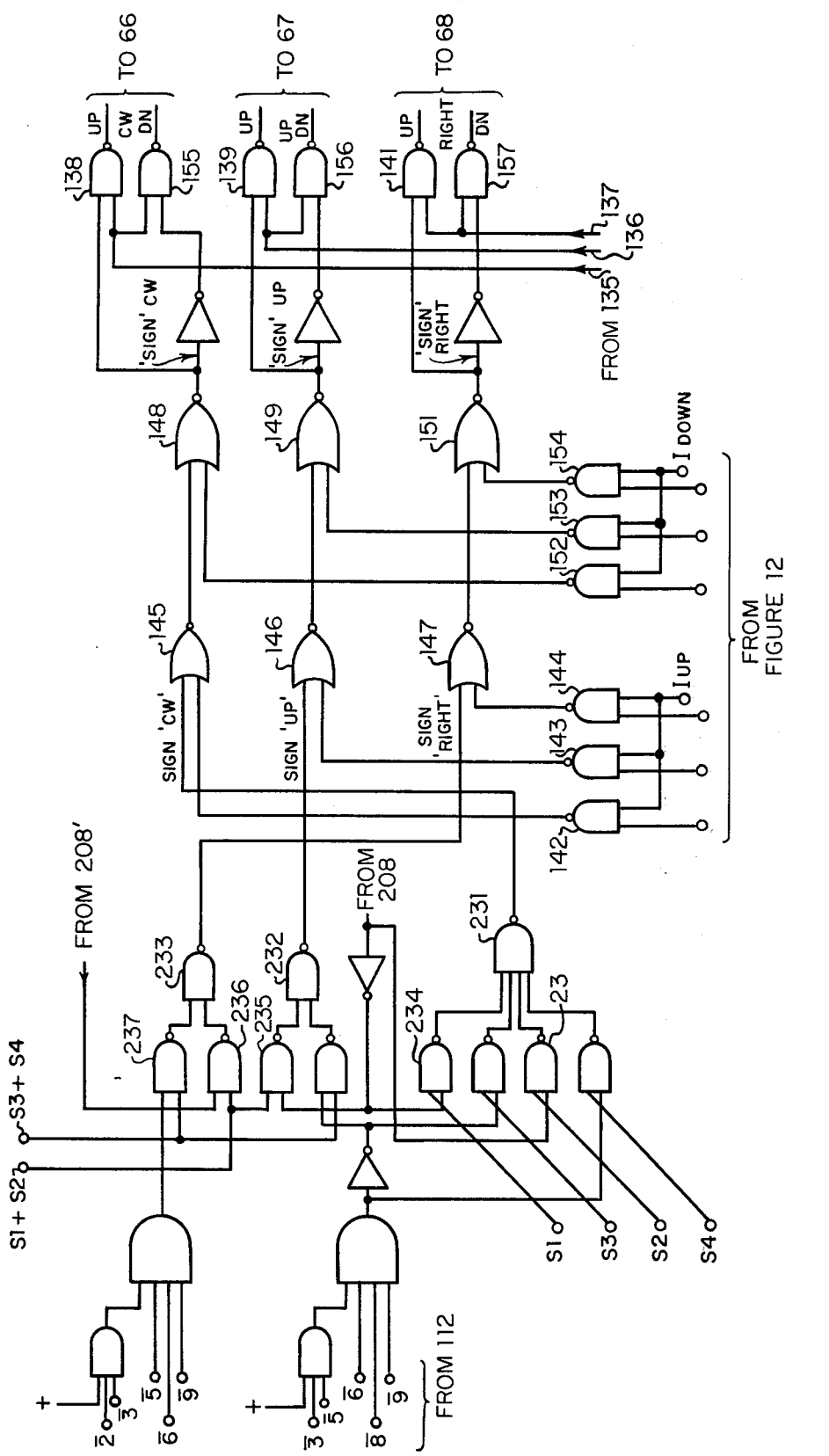
Figure 10:
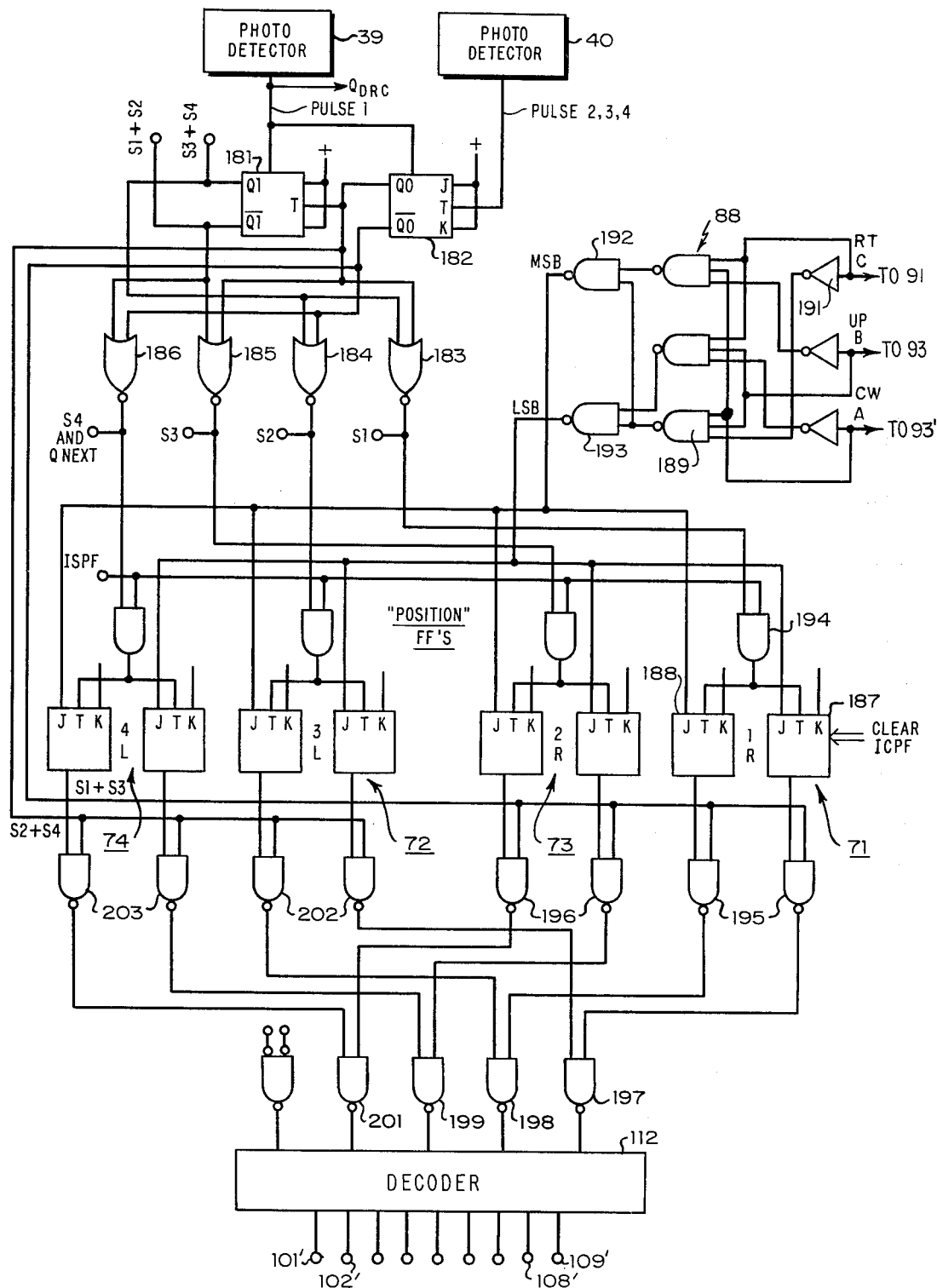
Figure 11:
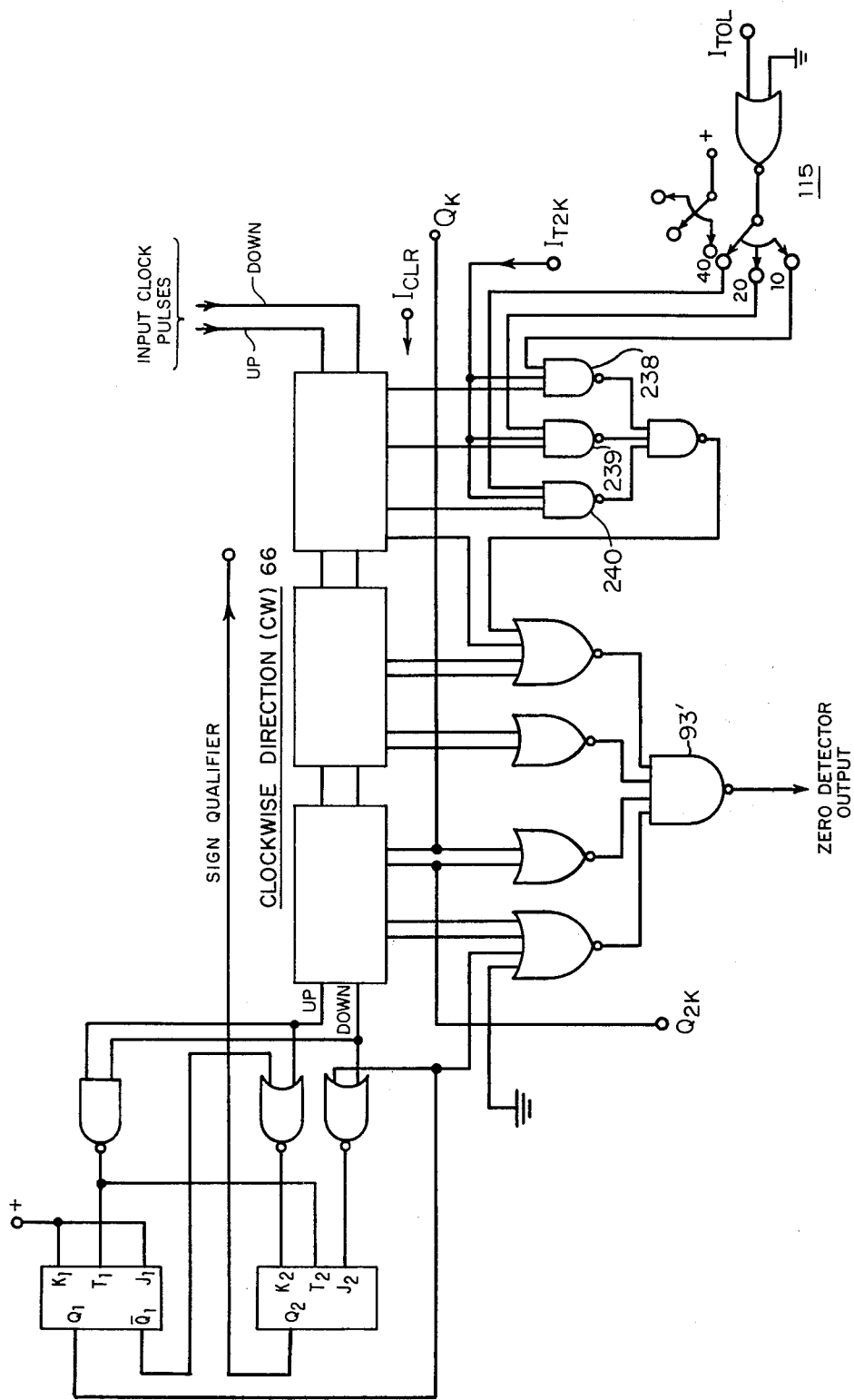
FIG. 11 is a schematic diagram illustrating one form of binary counter that may be used for the up-down direction counters of FIG. 6d.
Figure 12:
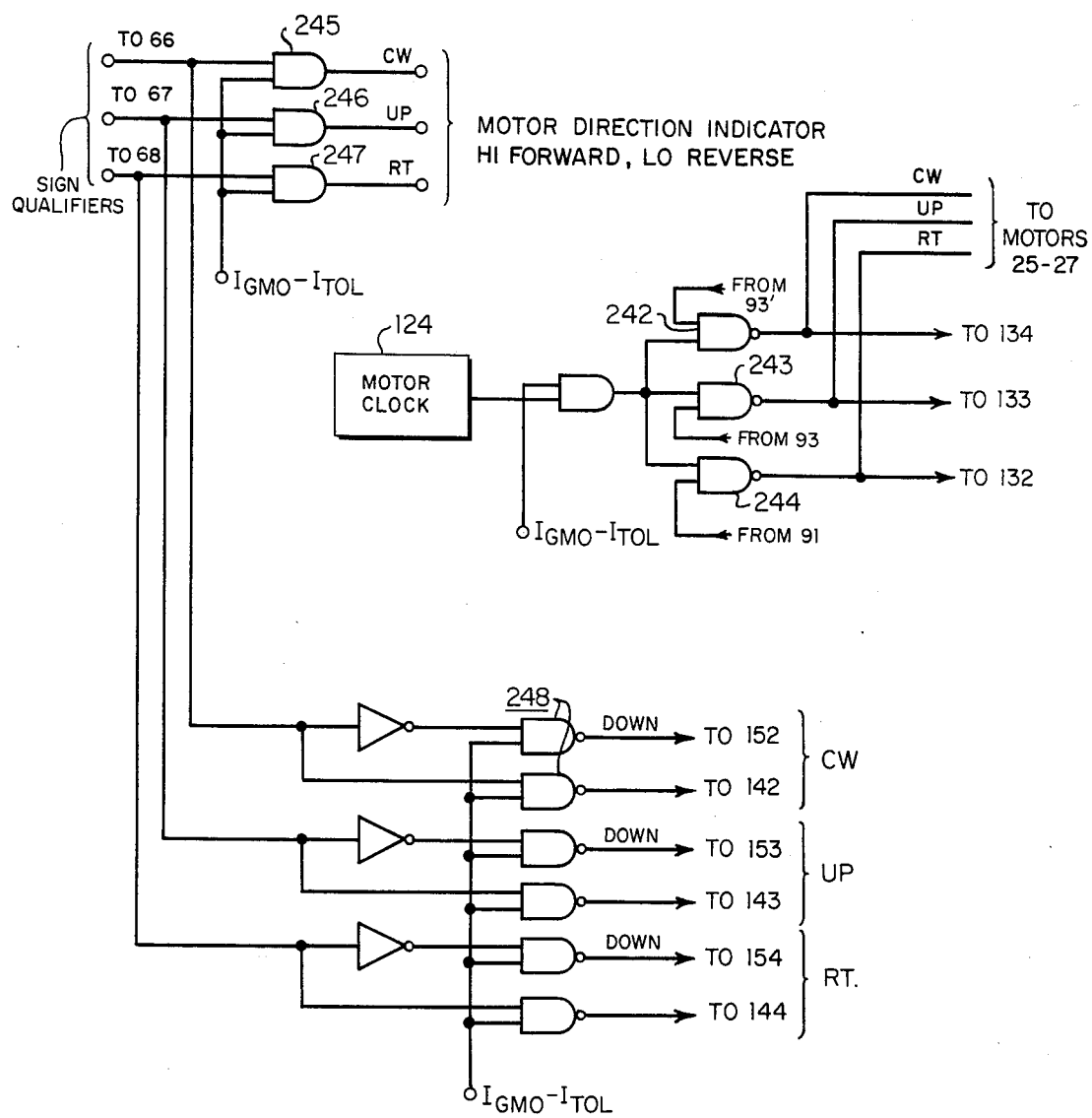
FIG. 12 is a schematic diagram of logic circuitry useful for the motor control system of FIG. 6b.

Certain of the circuits described above with reference to FIGS. 6a-d are disclosed in more detail in FIGS. 8–12. The formula magnitude determining network 78 and the counter input control circuit 81 are shown in FIGS. 8 and 9, with the formula sign determining network 114 also being included in FIG. 9. The logic circuitry for the scan counter 82, the decoder 83, the commutator 84, the decoder 88, the four pairs of position flip-flop circuits 71–74, the commutator 111, and the decoder 112 is shown in FIG. 10. One of the up-down counters 66 and the tolerance override circuit are shown in FIG. 11. The motor controller 123, the motor direction control circuits 126, and the stepping motor control circuit 125 are shown in FIG. 12.

Referring to FIGS. 8 and 9, the initial 2K count is stored in the three counters 66–68 when the $I_{CLK}$ and $I_{UP}$ instruction outputs are true, the $I_{CLK}$ instruction output then activating gate 131 to transmit clock pulses from the clock 79 through three gates 132, 133, and 134 and through three gates 135, 136, and 137 to three up-count gates 138, 139, and 141 leading to the up-count inputs of the clockwise, up, and right direction up-down counters 66, 67, and 68, respectively. The up-count gates 138, 139, and 141 are activated due to the true on the $I_{UP}$ instruction output, which is coupled to one input of each of three gates 142, 143, and 144. Since a false is present on the other inputs of these three gates 142–144, their outputs to each of the gates 145, 146, and 147 go true. This places a true on an input of each of the gates 148, 149, and 151, which in turn place a high on their outputs to activate the up-count gates 138, 139, and 141 to pass the clock pulses to the up inputs of the clockwise, up, and right direction counters 66–68. When the 2K count is reached, the $Q_{2K}$ qualifier input of the decoder circuit 61 is activated thereby switching the state counter 62 to state 0–7 and placing a false on the $I_{CLK}$ instruction output from the encoder circuit 63 to the gate 131 to terminate the application of clock pulses to the counters 66–68.

With the state counter 62 in state 0–7, the $I_{DN}$ instruction output goes true, activating gates 152, 153, and 154 and resulting in the activation of down-count gates 155, 156, and 157 so that during pulse periods A, B, and C the clock pulses C1 and C2 will be transmitted to the down inputs of the counters 66–68. At this time, the $I_{TEST}$ instruction output is also true and activates the A pulse right direction gate 161, the B pulse up direction gate 162, and the C pulse clockwise direction gate 163. On the first scan by slot 32, pulse A' activates gate 164 (via input A') to transmit clock pulses C1 from the clock 79 through gate 165 to an input of each of the three gates 166, 167, and 168 leading to the clockwise, up, and right direction counter gates 135, 136, and 137, respectively. Only gate 166 is activated since its other input is made high (via inverter 161') by the activation of gate 161. Thus, clock pulses C1 are transmitted via gate 166, gate 135, and down-count gate 155 to the down input of the clockwise up-down counter 66 which thereupon proceeds to count down from 2K.

When pulse A" from the pulse generator 53 appears shortly after the start of pulse A', gate 169 is activated (via input A") to pass a second series of clock pulses C2 from clock 79', which comprises a multivibrator driven by the clock pulses C1 from the main clock 79 (the clock pulses C2 from the clock 79' being spaced between successive clock pulses C1 from the main clock 79). The clock pulses C2 are transmitted via the gates 169, 165, and 166 to gate 135, and, thus, the rate of the clock pulses from clock 79 to the clockwise direction up-down counter 66 is doubled. At the end of pulse A', the clock pulses C1 passing through the gate 164 are terminated whereas the clock pulses C2 passing through the other gate 169 continue (in this clock pulse rate to the clockwise up-down counter 66 is halved to its normal rate). Therefore, during the existence of either pulse A' or A" in the absence of the other, the clock rate is just half the clock rate existing when pulses A' and A" coincide. This results in a pulse averaging effect and corrects for variable width pulses. The total time period for the passage of clock pulses C1 and C2 through gate 135 is referred to as pulse A or pulse period A.

During the existence of pulse B' from the pulse generator 49, gate 171 is activated (via input B') to pass clock pulses C1 via gate 172 and gate 173 to the up-direction gate 136 and the count-down gate 156 to the down input of the up-direction up-down counter 67. Pulse B" from the pulse generator 53 activates gate 174 to transmit clock pulses C2 via the gates 172, 173, 136, and 156 to the down input of the up-direction counter 67. The pulse averaging effect described above is produced by pulses B' and B" (the combined duration of these pulses being pulse B). The right direction up-down counter 68 operates in a similar manner to register clock pulses C1 and C2 during the combined duration of pulses C' and C" from the pulse generators 49 and 53 (this time period being referred to as pulse C).

In this manner, as the slot 32 of the scanning belt 31 scans the bars 14, 19, and 21, the three up-down counters 66–68 count down from the 2K count that had been registered in each of them before initiation of the scan by the pulse produced from hole 37 in the scanning belt. Having assumed in our example above that the bar 14 was located above the bars 19 and 21, 2K clock pulses are delivered to the right direction up-down counter 68. Thus, at the end of pulse C, the right direction up-down counter 68 will have counted down to zero and the output from its zero detector 91 to decoder 88 will have been made true.

The pattern position determining circuit is shown in detail in FIG. 10, the scan counter 82 comprising a pair of flip-flops 181 and 182 which operate in response to the four pulses from photosensors 39 and 40 during each scan series to activate gates 183–186 in sequence. In response to the first such pulse (at the beginning of the first scan by slot 32), gate 183 conditions the first pair 71 of position flip flop circuits 187 and 188 to receive the two-bit pattern position information from decoder 88. As stated above, the right direction counter 68 had counted down to zero, placing a true (in this case a low) on the output of its zero detector 91 and thus producing a high on an input of gate 189 via inverter 191. The output of gate 189 goes low to most-significant-bit gate 192 and least-significant-bit gate 193, the outputs of which both go high to the position flip-flop circuits 188 and 187, respectively. The I$_{SPF}$ instruction output at the end of the scan by slot 32 activates gate 194 to store these two bits (i.e., 1,1) in the position flip-flop circuits 187 and 188.

In response to the next three such pulses from photosensors 39 and 40 (at the beginning of each of the second, third, and fourth scans by slots 34, 33, and 35, respectively) pairs of bits (representing pattern position information from decoder 88) are subsequently stored in the second, third, and fourth pairs 72, 73, and 74 of position flip-flop circuits, respectively. The first such pulse from photosensor 39 at the start of the next scan series clears the two flip-flops 181 and 182 to place a true on an input of each of the four gates 195 and 196 associated with the first and third pairs 71 and 73 of position flip-flop circuits, the four bits of pattern position information from these two pairs of position flip-flop circuits thereupon being transmitted through the four gates 197, 198, 199, and 201 to the decoder 112 where the single output 101' is made true to signify that the two bars 14 and 15 share the sector 101 in common. The other eight output leads 102'–109' of the decoder 112 remain false. As the following scan by slot 34 begins, the next such pulse from photosensor 40 results in a true being placed on an input of each of the four gates 202 and 203, the two-bit pattern position information from the two pairs 72 and 74 of position flip-flop circuits thereupon being transmitted through those gates to the decoder 112 whereupon a particular output of the decoder 112 is made true for that scan.

In a similar manner, as the following two scans by slots 33 and 35 begin, the next two such pulses from photosensor 40 function as described above to transmit the two-bit position information registered in the two pairs 71 and 73 of position flip-flop circuits and the two pairs 72 and 74 of position flip-flop circuits, respectively, to the decoder 112. This produces an output on one particular output of the decoder 112 for each of those following two scans.

Referring to FIG. 8 and assuming that output 109' of decoder 112 is activated for the first and third scans, a true is placed on inputs $\overline{9}$ (the inputs $\overline{1}$, $\overline{2}$, $\overline{3}$, etc. being made true or false by the outputs 101', 102', 103', etc., respectively, of decoder 112) and on the first scan input (S1) from flip-flop 181 during the first scan. This activates gates 206, 207, 208, and 209, which in turn activate gates 211, 163, and 212 and their associated inverters to place a high on one input of each gate 213, 214 and 215 thereby opening these three gates to permit clock pulses C1 and C2 to flow the three up-down counters 66–68 from the clocks 79 and 79' during the existance of pulse C (i.e., C'+C") on the designated inputs to gates 216 and 217.

During the third scan, with the inputs $\overline{9}$ again true and with the third scan inputs (S3) true, gates 218, 219, 221, and 222 are activated to in turn activate gates 163, 214, 162, 173, and 223. Clock pulses C1 and C2 are therefore passed to the clockwise direction counter 66 via gates 223 and 135 during pulse B, to the up-direction counter 67 via gates 173 and 136 during pulse B, and to the right direction counter 68 via gates 214 and 137 during pulse C.

Assuming for purposes of this description that inputs $\overline{4}$ (from output 104' of decoder 112) are activated for the second and fourth scans, during the second scan (S2) gates 207 and 224 would be activated with the result that clock pulses C1 and C2 would be transmitted to the right direction counter 68 via gates 162', 168, and 137 during pulse A and to both the clockwise and up-direction counters 66 and 67 via gates 211, 213, and 135 and 212, 215, and 136, respectively, during pulse C. Similarly, during the fourth scan (S4) gates 225 and 226 would be activated to cause clock pulses C1 and C2 to flow to the clockwise, up, and right direction counters 66–68 during pulse A.

The sign for each formula, which determines whether the clockwise, up, and right direction counters 66, 67, and 68 count up or down, is determined by gates 231, 232, and 233, respectively (FIG. 9). For example, during the first scan by slot 32 with output 109' of decoder 12 activated, gates 234 and 235 are activated since their S1 inputs and their other inputs from gate 208 via the associated inverter are true. This makes the outputs from gates 234 and 235 to gates 231 and 232 go true thereby making the gates 231 and 232 go high. Gate 236 is also activated since its S1 input and its other input from gate 208' are true thereby making gates 233 go high. Thus, one input of each gate 145, 146, and 147 goes high, making the outputs from those gates to gates 148, 149, and 151 go low. This enables the gates 138, 139, and 141 to direct clock pulses C1 and C2 to the "up" inputs of the clockwise, up, and right direction counters 66, 67, and 68, respectively. Thus, during the first scan by slot 32 with output 109' of decoder 112 true, all the counters 66–68 count up (as indicated by the + sign of the "+C$_1$" term in the sector row 109 of the above table for all three direction formulae).

During the third scan by slot 33 with output 109' of decoder 112 true, the output of gate 237 goes high due to the combination of a low and a high on its two inputs. Since a high is present on the output of gate 236, the output of gate 233 to gate 147 therefore goes low. Clock pulses C1 and C2 are therefore directed to the "down" count input of the right direction counter 68. This concurs with the "−C$_3$" term in the sector row 109 of the right direction formula column in the above table. Since the outputs of gates 231 and 232 are high, clock pulses C1 and C2 are directed to the "up" count inputs of the clockwise and up direction counters 66 and 67 as indicated by the "+B$_3$" term in the sector row 109 of the clockwise and up direction formulae columns in the above table.

A typical form of binary coded decimal counter employed for the clockwise direction up-down counter 66 (as well as for the up and right direction up-down counters 67 and 68) is shown in FIG. 11. The tolerance override circuit comprises three gates 238, 239, and 240, which are all activated by a true on their I$_{T2K}$ inputs to override the binary information on the first three binary outputs to the zero detector 93' and indicate to the zero detector that those three binary outputs are all zero, even though up to an eight count may actually be present. All three gates 238, 239, and 240 are also controlled from the tolerance switch 115 so that gate 238 is activated to override the first binary output when the tolerance switch 115 is set for a ± 10 uin. tolerance, so that gates 238 and 239 are activated to override the first and second binary outputs when the tolerance switch 115 is set for a ± 20 uin. tolerance, and so that all three gates 238, 239, and 240 are activated to override the first three binary outputs when the tolerance switch is set for a ± 40 uin. tolerance. The circuitry in the upper left-hand portion of FIG. 11 provides the sign information to direct the motor drives in the forward or reverse direction depending on the up or down count stored in the associated counter.

The gate circuits for the motor controlled system are shown in FIG. 12. They include gates 242, 243, and 244 for delivering clock pulses to the stepping motors, gates 245, 246, and 247 for designating the direction of motor movement, and gates 248 for directing pulse trains to the counters 66, 67, and 68 to count them back to zero.

Figures 13, 14:
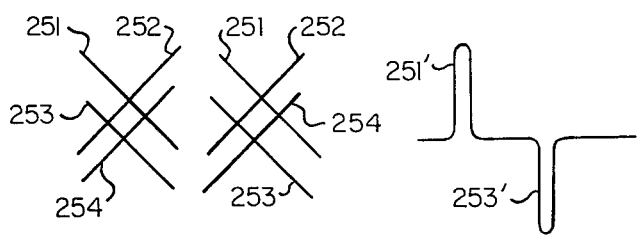
FIG. 13 is a view of the two alignment pattern areas where each pair of alignment patterns on the wafer and mask comprises a pair of single crosses in lieu of the alignment pattern arrangement of FIG. 2.
FIG. 14 is a waveform trace showing the positive and negative pulses obtained in a single scan of an associated pair of lines in the alignment pattern arrangement of FIG. 13.

The alignment patterns may take other forms as illustrated in FIG. 13. In that case, the single cross 251 and 252 on one object may be opaque and the single cross 253 and 254 on the other object may be reflective. The opaque and reflective bars, for example, bars 251 and 253, when scanned, will give pulses of opposite sign as indicated by pulses 251' and 253' of FIG. 14. Thus, the spacing between the pulses and the direction of the first pulse relative to the direction of the second pulse may be utilized by the logic circuitry to compute the extent of misalignment and provide corrective drive signals.

We claim:

1. A system for aligning first and second relatively movable objects, where the first object has an alignment pattern thereon, the second object has a corresponding alignment pattern thereon, and the alignment pattern on the first object is disposed in a preselected alignment position relative to the corresponding alignment pattern on the second object when the first and second objects are aligned, said system comprising first means operable for repetitively determining the angular and the coordinate displacement between the alignment pattern on the first object and the preselected alignment position relative to the corresponding alignment pattern on the second object, and second means operable following each such determination by the first means for moving the first object relative to the second object through an angle and a distance based on that determination to incrementally bring the alignment pattern on the first object into the preselected alignment position relative to the corresponding alignment pattern on the second object.

2. A system as in claim 1 wherein said first object comprises a semiconductive wafer, and said second object comprises a mask.

3. A system as in claim 1 wherein said first means includes mesuring means operable for repetitively measuring the angular and the coordinate displacement between the corresponding alignment patterns on the first and second objects, said first means further includes processing means operable following each such measurement by the measuring means for processing the measured angular and coordinate displacement to compute the angle and the distance the alignment pattern on the first object is removed from the preselected alignment position relative to the alignment pattern on the second object, and said second means comprises control means operable following each such computation by the processing means for moving the first object through the computed angle and distance relative to the second object before the next measurement by the measuring means.

4. A system as in claim 3 wherein said measuring and processing means and said control means are operable up to a predetermined maximum number of times to incrementally bring the alignment pattern on the first object into the preselected alignment position relative to the corresponding alignment pattern on the second object.

5. A system as in claim 4 wherein said first object comprises a semiconductive wafer, and said second object comprises a mask.

6. A system as in claim 1 wherein said alignment pattern on the first object comprises coordinate marks, said alignment pattern on the second object comprises corresponding coordinate marks, said first means is operable for repetitively determining the angular and the coordinate displacement between the coordinate marks of the alignment pattern on the first object and the preselected alignment position relative to the corresponding coordinate marks of the corresponding alignment pattern on the second object, and said second means is operable following each such determination by the first means for moving the first object relative to the second object through an angle and a coordinate distance based on that determination to incrementally bring the coordinate marks of the alignment pattern on the first object into the preselected alignment position relative to the corresponding coordinate marks of the corresponding alignment pattern on the second object.

7. A system as in claim 6 wherein said first means includes measuring means operable for repetitively measuring the angular and the coordinate displacement between the coordinate marks of the alignment pattern on the first object and the corresponding coordinate marks of the corresponding alignment pattern on the second object, said first means further includes processing means operable following each such measurement by the measuring means for processing the measured angular and coordinate displacement to compute the angle and the coordinate distance the coordinate marks of the alignment pattern on the first object are removed from the preselected alignment position relative to the corresponding coordinate marks of the corresponding alignment pattern on the second object, and said second means comprises control means operable following each such computation by the computation means for moving the first object through the computed angle and coordinate distance relative to the second object before the next measurement by the measuring means.

8. A system as in claim 7 wherein said measuring and processing means and said control means are operable up to a predetermined maximum number of times to bring the coordinate marks of the alignment pattern on the first object into the preselected alignment position relative to the corresponding coordinate marks of the corresponding alignment pattern on the second object.

9. A system as in claim 8 wherein said first object comprises a semiconductive wafer, and said second object comprises a mask.

10. A system as in claim 1 wherein said first object has a pair of spaced alignment patterns thereon, said second object has a corresponding pair of spaced alignment patterns thereon, each of said alignment patterns on the first object is disposed in the preselected alignment position relative to the corresponding alignment pattern on the second object when the first and second objects are aligned, said first means is operable for repetitively determining the angular and the coordinate displacement between each of the alignment patterns on the first object and the preselected alignment position relative to the corresponding alignment pattern on the second object, and said second means is operable following each such determination by the first means for moving the first object through a distance and an angle based on that determination to incrementally bring each of the alignment patterns on the first object into the preselected alignment position relative to the corresponding alignment pattern on the second object.

11. A system as in claim 10 wherein each of said alignment patterns on the first object comprises coordinate marks, each of said alignment patterns on the second object comprises corresponding coordinate marks, said first means is operable for repetitively determining the angular and the coordinate displacement between the coordinate marks of each of the alignment patterns on the first object and the preselected alignment position relative to the corresponding coordinate marks of the corresponding alignment pattern on the second object, and said second means is operable following each such determination by the first means for moving the first object relative to the second object through an angle and a coordinate distance based on that determination to incrementally bring the coordinate marks of each of the alignment patterns on the first object into the preselected alignment position relative to the corresponding coordinate marks of the corresponding alignment pattern on the second object.

12. A system as in claim 11 wherein said first means includes measuring means operable for repetitively measuring the coordinate displacement between the coordinate marks of each of the alignment patterns on the first object and the corresponding coordinate marks of the corresponding alignment pattern on the second object, said first means further includes processing means operable following each such measurement by the measuring means for processing the measured coordinate displacements to compute the angle and the coordinate distance the coordinate marks of each of the alignment patterns on the first object are removed from the preselected alignment position relative to the corresponding coordinate marks of the corresponding alignment pattern on the second object, and said second means comprises control means operable following each such computation by the computation means for moving the first object through the computed angle and coordinate distance relative to the second object before the next measurement by the measuring means.

13. A system as in claim 12 wherein said measuring and processing means and said control means are operable up to a predetermined maximum number of times to bring the coordinate marks of each of the alignment patterns on the first object into the preselected alignment position relative to the corresponding coordinate marks of the corresponding alignment pattern on the second object.

14. A system as in claim 13 wherein said coordinate marks of each of the alignment patterns on the first object comprise first and second coordinate marks oriented at an angle relative to one another, said coordinate marks of each of the corresponding alignment patterns on the second object comprise first and second coordinate marks oriented at substantially the same angle relative to one another as the first and second coordinate marks of each of the alignment patterns on the first object, said measuring means is operable for repetitively measuring the coordinate distance between the first and second coordinate marks of each of the alignment patterns on the first object and the first and second coordinate marks, respectively, of the corresponding alignment pattern on the second object, said processing means is operable following each such measurement by the measuring means for processing the measured coordinate displacements to compute the angle and the coordinate distance the first and second coordinate marks of each of the alignment patterns on the first object are removed from the preselected alignment position relative to the corresponding first and second coordinate marks, respectively, of the corresponding alignment pattern on the second object, and said control means is operable following each such computation by the processing means for moving the first object through the computed angle and distance relative to the second object to incrementally bring the first and second coordinate marks of each of the alignment patterns on the first object into the preselected alignment position relative to the first and second coordinate marks, respectively, of the corresponding alignment pattern on the second object with the first and second coordinate marks of each of the alignment patterns on the first object oriented substantially parallel to the first and second coordinate marks, respectively, of the corresponding alignment pattern on the second object.

15. A system as in claim 14 wherein said first object comprises a semiconductive wafer, said first and second coordinate marks of each of the alignment patterns on the first object are orthogonally oriented relative to one another on the semiconductive wafer, said second object comprises a mask, and said first and second coordinate marks of each of the alignment patterns on the second object are orthogonally oriented relative to one another on the mask.

16. A system for aligning first and second relatively movable objects, where the first object has a pattern thereon, the second object has a corresponding pattern thereon, and the pattern on the first object is disposed in a preselected position relative to the corresponding pattern on the second object when the first and second objects are aligned, said system comprising first means operable for repetitively determining the angular and the coordinate displacement between the pattern on the first object and the preselected position relative to the corresponding pattern on the second object, and second means operable following each such determination by the first means for moving the first object relative to the second object through an angle and a distance based on that determination to incrementally bring the pattern on the first object into the preselected position relative to the corresponding pattern on the second object.

17. A system as in claim 16 wherein said first object comprises a semiconductive wafer, and said second object comprises a mask.

18. A system as in claim 16 wherein said first means includes measuring means operable for repetitively measuring the angular and the coordinate displacement between the corresponding patterns on the first and second objects, said first means further includes processing means operable following each such measurement by the measuring means for processing the measured angular and coordinate displacement to compute the angle and the distance the pattern on the first object is removed from the preselected position relative to the pattern on the second object, and said second means comprises control means operable following each such computation by the processing means for moving the first object through the computed angle and distance relative to the second object before the next measurement by the measuring means.

19. A system as in claim 18 wherein said measuring and processing means and said control means are operable up to a predetermined maximum number of times to incrementally bring the pattern on the first object into the preselected position relative to the corresponding pattern on the second object.

20. A system as in claim 19 wherein said first object comprises a semiconductive wafer, and said second object comprises a mask.

* * * * *

UNITED STATES PATENT AND TRADEMARK OFFICE
CERTIFICATE OF CORRECTION

PATENT NO. : 4,070,117
DATED : January 24, 1978
INVENTOR(S) : Karl-Heinz Johannsmeier, Paul E. Stoft, Tor G. Larsen It is certified that error appears in the above-identified patent and that said Letters Patent are hereby corrected as shown below:

Item [54], in the title "E.G. A SEMICONDUCTOR WAFER AND MASK" should read "FOR EXAMPLE, A SEMICONDUCTOR WAFER AND A TRANSPARENT MASK";

Column 1, lines 4-5, in the title "E.G. A SEMICONDUCTOR WAFER AND MASK" should read "FOR EXAMPLE, A SEMICONDUCTOR WAFER AND A TRANSPARENT MASK";

Column 1, line 29 cancel "added" and substitute "aided";

Column 1, line 53, cancel "radicals" and substitute "radials";

Column 3, line 62, "the" should read "The";

Column 4, line 13, immediately following "alignment" insert "with the alignment";

Column 5, line 4, cancel "open" and substitute "one";

Column 5, line 6, cancel "over" and substitute "area";

Column 7, line 50, cancel "gears" and substitute "gates";

Column 8, line 4, cancel "seats" and substitute "sets";

Column 8, line 25, immediately following "up-down" insert "counters 66-68";

Column 9, line 40, cancel "1-1" (second occurrence) and substitute "1-0";

Column 10, line 36 cancel "rourth" and substitute "fourth";

Column 12, lines 52, 53, and 55, each occurrence of "uin" should read "μin";

Column 13, lines 1, 2, and 4, each occurrence of "uin" should read "μin";

UNITED STATES PATENT AND TRADEMARK OFFICE
CERTIFICATE OF CORRECTION

PATENT NO. : 4,070,117
DATED : January 24, 1978
INVENTOR(S) : Karl-Heinz Johannsmeier, Paul E. Stoft, Tor G. Larsen It is certified that error appears in the above—identified patent and that said Letters Patent are hereby corrected as shown below:

Column 13, line 33, immediately following "vertically" insert "up";

Column 16, lines 14, 20, 21, and 23, cancel each occurrence of "mask" and substitute "wafer";

Column 16, line 45, cancel "the" (first occurrence) and substitute "to";

Column 18, line 17, immediately following "this" insert "case the";

Column 19, line 48, immediately following "214" insert a comma;

Column 19, line 51, cancel "existance" and substitute "existence";

Column 19, line 55, cancel "inputs" and substitute "input";

Column 20, line 13 cancel "12" and substitute "112"; and

Column 20, lines 58, 61, and 64, each occurrence of "uin" should read "$\mu$in".

Signed and Sealed this

Fourth Day of December 1979

[SEAL]

Attest:

SIDNEY A. DIAMOND

Attesting Officer      Commissioner of Patents and Trademarks